US012704707B2

(12) United States Patent
Kanzaki et al.

(10) Patent No.: US 12,704,707 B2
(45) Date of Patent: Aug. 11, 2026

(54) MICROSCOPE SYSTEM

(71) Applicant: Hitachi High-Tech Corporation, Tokyo (JP)

(72) Inventors: Nobuhiko Kanzaki, Tokyo (JP); Yuko Otani, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 892 days.

(21) Appl. No.: 17/693,047

(22) Filed: Mar. 11, 2022

(65) Prior Publication Data

US 2022/0308331 A1 Sep. 29, 2022

(30) Foreign Application Priority Data

Mar. 26, 2021 (JP) ................................ 2021-053385

(51) Int. Cl.
*G02B 21/00* (2006.01)
*G02B 21/06* (2006.01)
(Continued)

(52) U.S. Cl.
CPC ........... *G02B 21/365* (2013.01); *G02B 21/06* (2013.01); *G02B 21/241* (2013.01);
(Continued)

(58) Field of Classification Search
CPC ........................... G02B 21/00; G02B 21/0004; G02B 21/0012; G02B 21/0016; G02B 21/0032;
(Continued)

(56) References Cited

U.S. PATENT DOCUMENTS

| | | | | |
|---|---|---|---|---|
| 6,140,415 A * | 10/2000 | Gupta | .................. | B29C 45/382 525/56 |
| 7,075,046 B2 * | 7/2006 | Kennedy | ............. | G02B 21/245 359/383 |

(Continued)

FOREIGN PATENT DOCUMENTS

| | | |
|---|---|---|
| JP | 2007-225627 A | 9/2007 |
| JP | 2012-26733 A | 2/2012 |

(Continued)

OTHER PUBLICATIONS

Korean-language Office Action issued in Korean Application No. 10-2022-0030701 dated Aug. 5, 2024 with English translation (11 pages).

*Primary Examiner* — Thong Q Nguyen
(74) *Attorney, Agent, or Firm* — Crowell & Moring LLP

(57) ABSTRACT

Regarding a microscope system, a technique capable of suitably achieving a focusing on a surface of a sample is provided. The microscope system includes an irradiation optical system (laser light source 101 or the like) that irradiates a surface of a sample 3 on a stage 104 with light from an oblique direction, an observation optical system (camera 112 or the like) that forms an image of scattered light from the surface of the sample 3, a focus mechanism (piezo stage 106 or the like) that changes a height position of focus with respect to the surface of the sample 3, and a computer system 100 that acquires an image from the observation optical system. Regarding the sample 3, the computer system acquires a first image in a first focus state and a second image in a second focus state, in which the first image and the second image have different focus heights, calculates an amount of change between a position of a first spot pattern in the first image and a position of a second spot pattern in the second image, calculates an amount of change in height of the sample 3 based on an incident angle in the
(Continued)

oblique direction and the amount of change in position of spot pattern, and adjusts the height position of the focus by using the amount of change in sample height so as to focus on the surface of the sample 3.

10 Claims, 13 Drawing Sheets

(51) Int. Cl.

| | |
|---|---|
| ***G02B 21/24*** | (2006.01) |
| ***G02B 21/36*** | (2006.01) |
| ***G06T 7/00*** | (2017.01) |
| ***G06T 7/73*** | (2017.01) |
| ***H01J 37/21*** | (2006.01) |
| ***H01J 37/26*** | (2006.01) |

(52) U.S. Cl.

CPC .............. *G06T 7/0004* (2013.01); *G06T 7/74* (2017.01); *H01J 37/21* (2013.01); *H01J 37/265* (2013.01); *G06T 2207/10056* (2013.01); *G06T 2207/30148* (2013.01)

(58) Field of Classification Search

CPC ......................... G02B 21/0052; G02B 21/006; G02B 21/008; G02B 21/02; G02B 21/06; G02B 21/084; G02B 21/10; G02B 21/24; G02B 21/241; G02B 21/242; G02B 21/244; G02B 21/36; G02B 21/361; G02B 21/365; G02B 21/367; G06T 7/0004; G06T 7/74; H01J 37/21; H01J 37/265

USPC .................................................. 359/368–398

See application file for complete search history.

(56) References Cited

U.S. PATENT DOCUMENTS

| | | | | |
|---|---|---|---|---|
| 8,264,768 | B2 * | 9/2012 | Kawanabe | G01N 21/6458 359/383 |
| 8,982,457 | B2 * | 3/2015 | Tani | G02B 21/125 359/385 |
| 9,013,787 | B2 * | 4/2015 | Kusunose | G01N 21/9505 356/237.1 |
| 9,690,088 | B2 * | 6/2017 | Karube | G02B 21/082 |
| 2012/0097835 | A1 | 4/2012 | Sharonov | |
| 2012/0307238 | A1 * | 12/2012 | Fujita | G02B 21/002 356/338 |
| 2013/0284924 | A1 | 10/2013 | Mizuochi et al. | |

FOREIGN PATENT DOCUMENTS

| | | | |
|---|---|---|---|
| JP | 2012-146581 | A | 8/2012 |
| KR | 10-2012-0039547 | A | 4/2012 |

* cited by examiner

[FIG. 1]
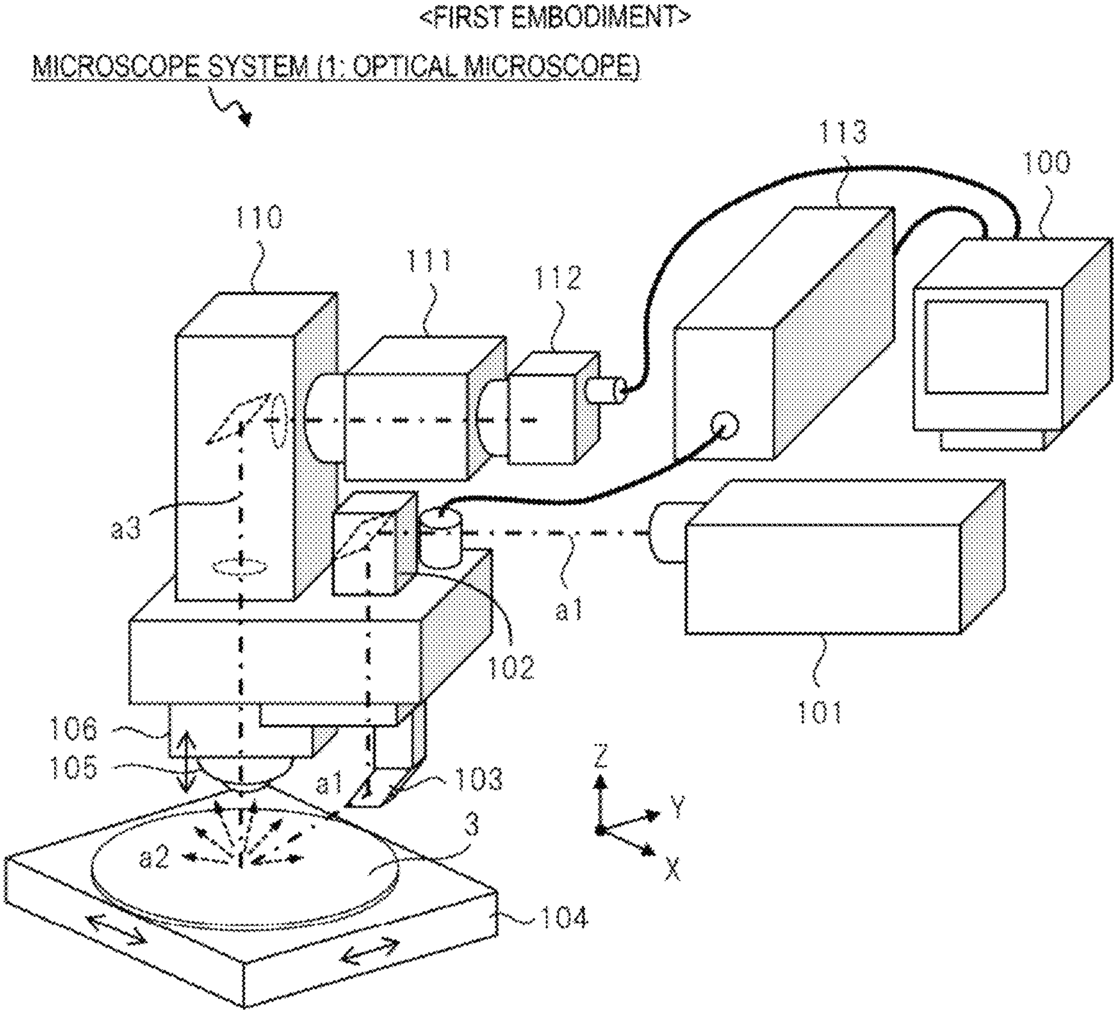
3: SAMPLE (BARE WAFER)
101: LASER LIGHT SOURCE (DARK FIELD ILLUMINATION UNIT)
102: LASER AXIS ADJUSTMENT MIRROR
103: IRRADIATION MIRROR
104: STAGE
105: OBJECTIVE LENS
106: PIEZO STAGE (FOCUS STAGE)
110: MICROSCOPE BODY
111: SPATIAL FILTER
112: CAMERA
113: PIEZO STAGE CONTROLLER
100: CONTROLLER (COMPUTER SYSTEM)

[FIG. 2]
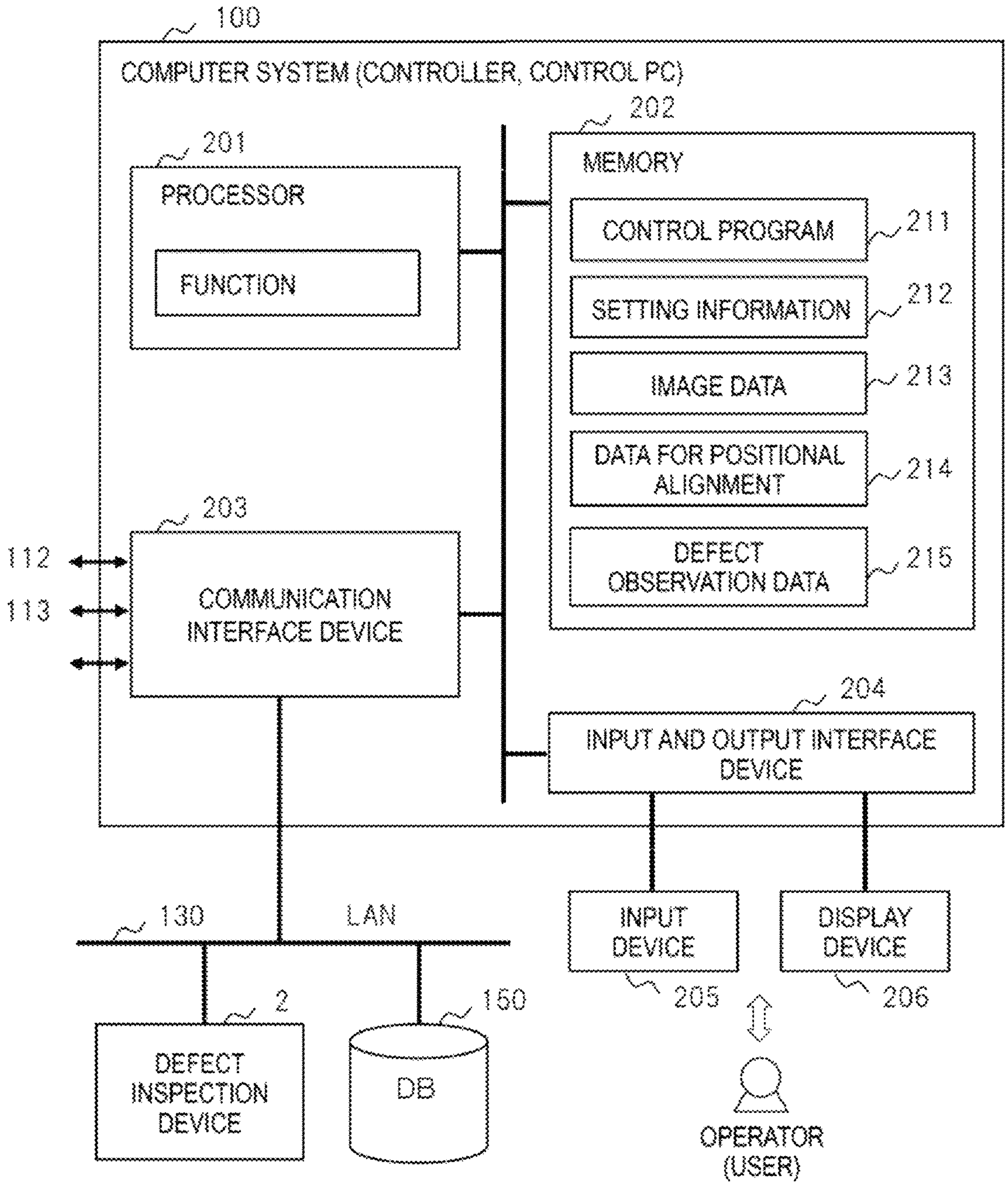

[FIG. 3]
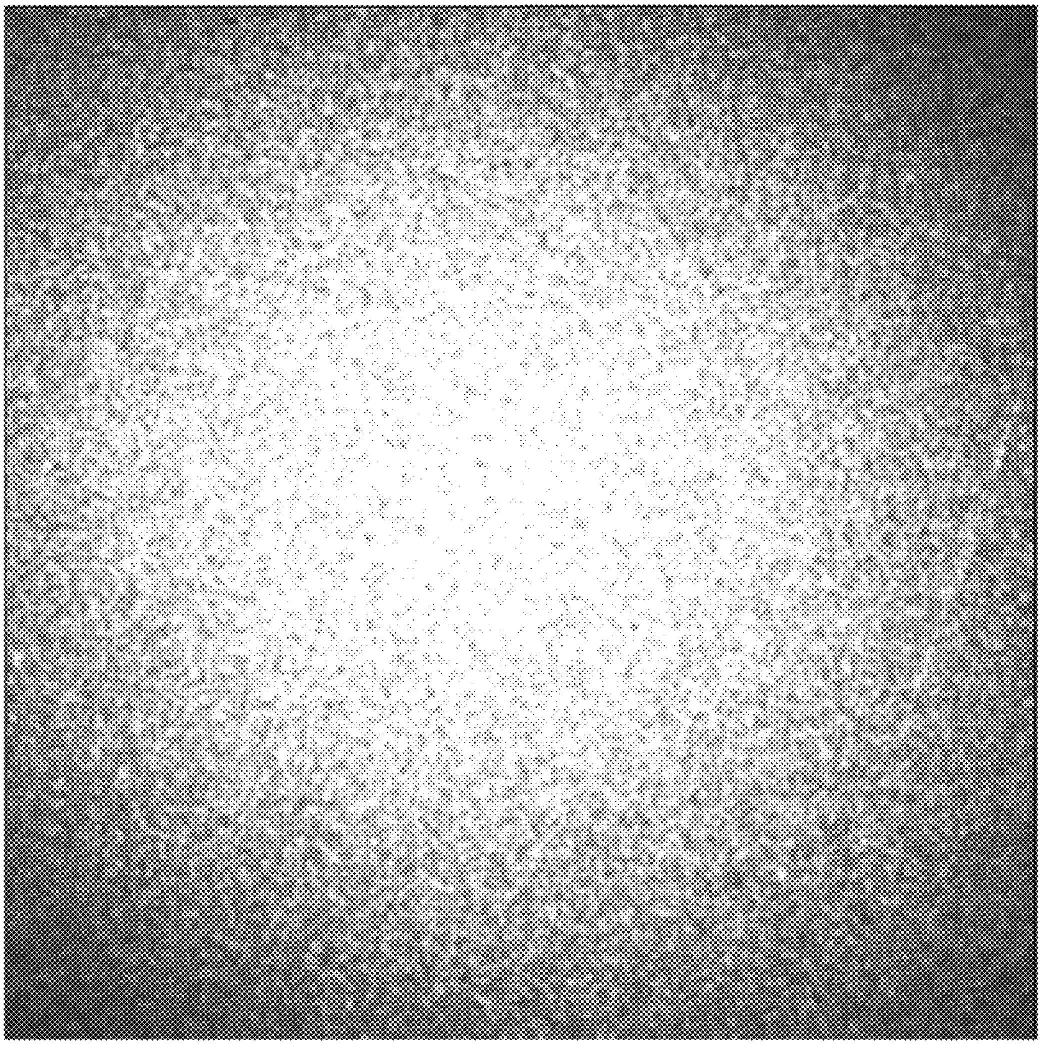

110
a3
102
106
103
105
400
(FC)
ZA
ZB
ZC
ZD
3
θ
a1
ΔZ
ΔD
L2(X2,Y2)
L1(X1,Y1)
L1(X1,Y1)
L1(X1,Y1)
401
SP2
402
403
SP1
SP3
SP1
411
ΔD
412
413

[FIG. 5]
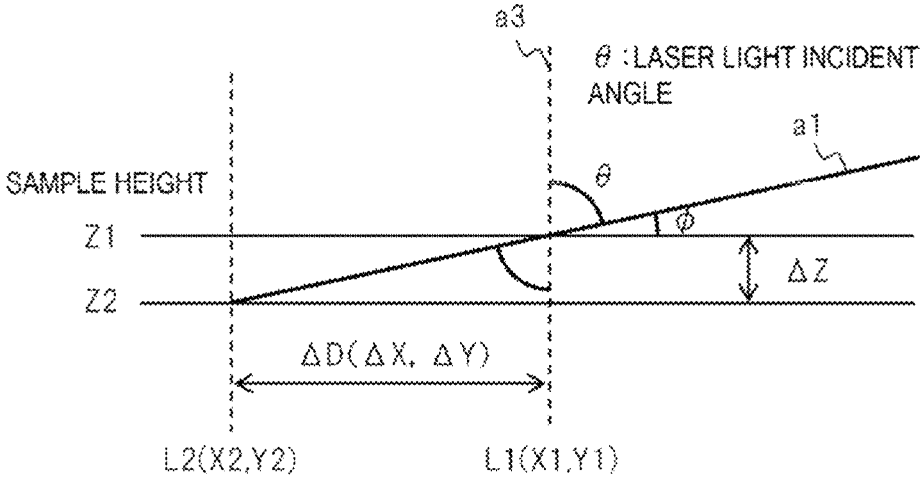
CALCULATION FORMULA
FORMULA 1: $\tan\theta = \Delta D(\Delta X, \Delta Y) / \Delta Z$
FORMULA 2: $\Delta Z = \Delta D(\Delta X, \Delta Y) / \tan\theta$

[FIG. 6]
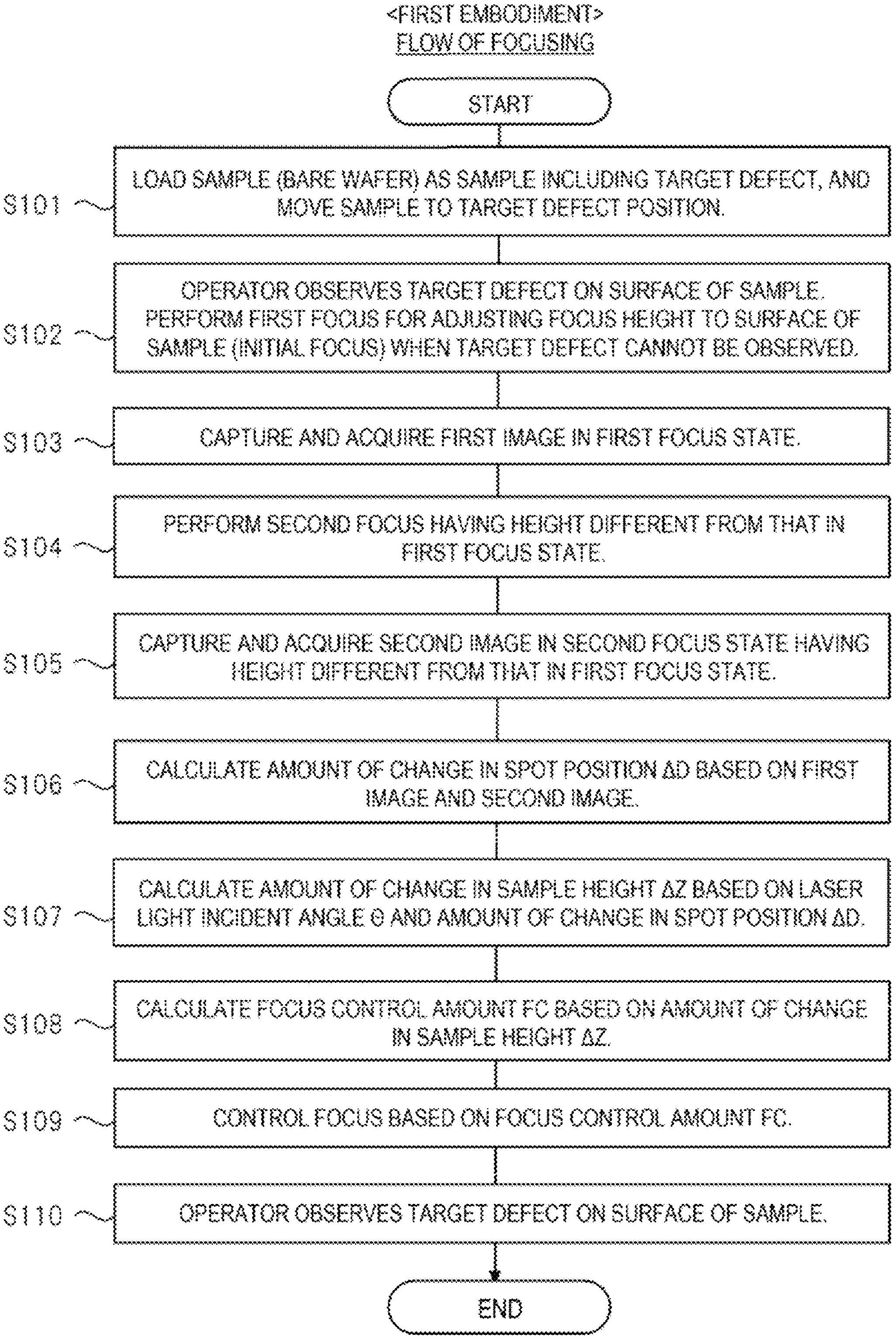

[FIG. 8]
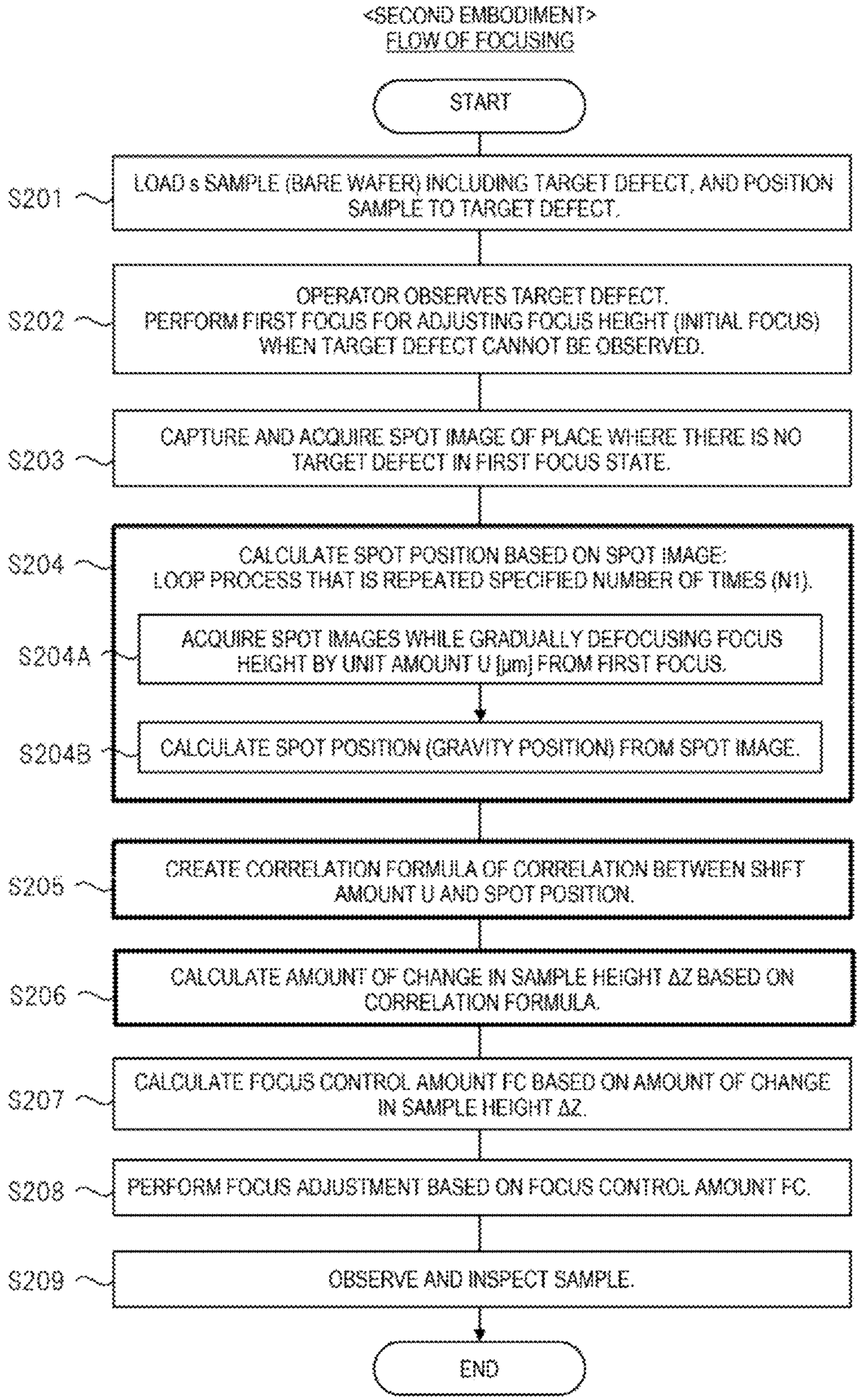

[FIG. 10]
| | FOCUS HEIGHT (Z) [μm] | SHIFT AMOUNT (U) [μm] OF FOCUS HEIGHT | SPOT POSITION SP (X, Y) | SHIFT AMOUNT (Δd) [μm] OF SPOT POSITION | |
|---|---|---|---|---|---|
| 1 | Z1 | 0 | (X1,Y1) | Δd1 ($\sqrt{}$(X1$^2$+Y1$^2$)) | |
| 2 | Z2 | +1U | (X2,Y2) | Δd2 ($\sqrt{}$(X2$^2$+Y2$^2$)) | |
| 3 | Z3 | +2U | (X3,Y3) | Δd3 ($\sqrt{}$(X3$^2$+Y3$^2$)) | |
| 4 | Z4 | +3U | (X4,Y4) | Δd4 ($\sqrt{}$(X4$^2$+Y4$^2$)) | |
SCATTERING DIAGRAM
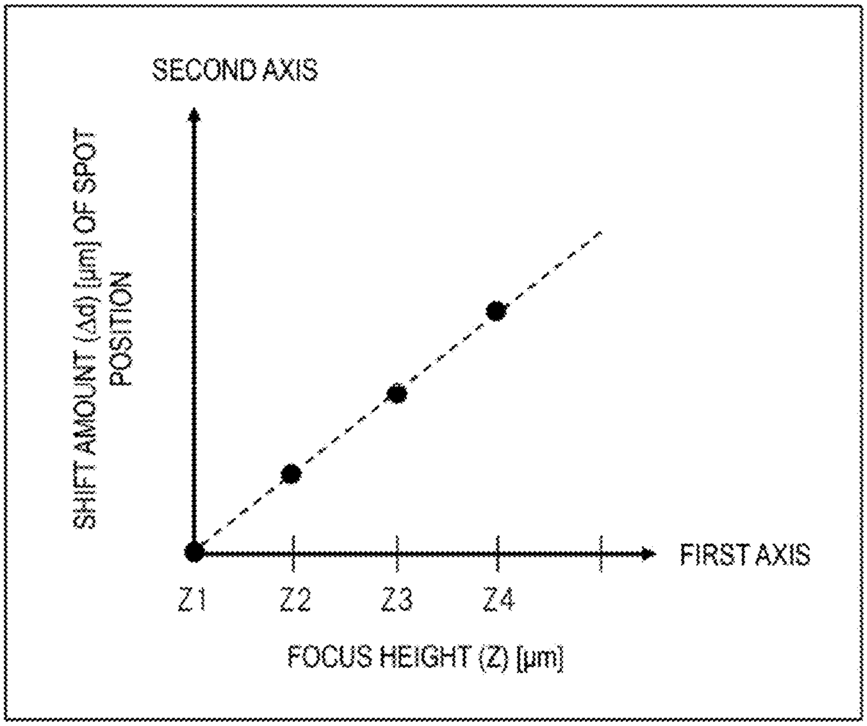

[FIG. 11]
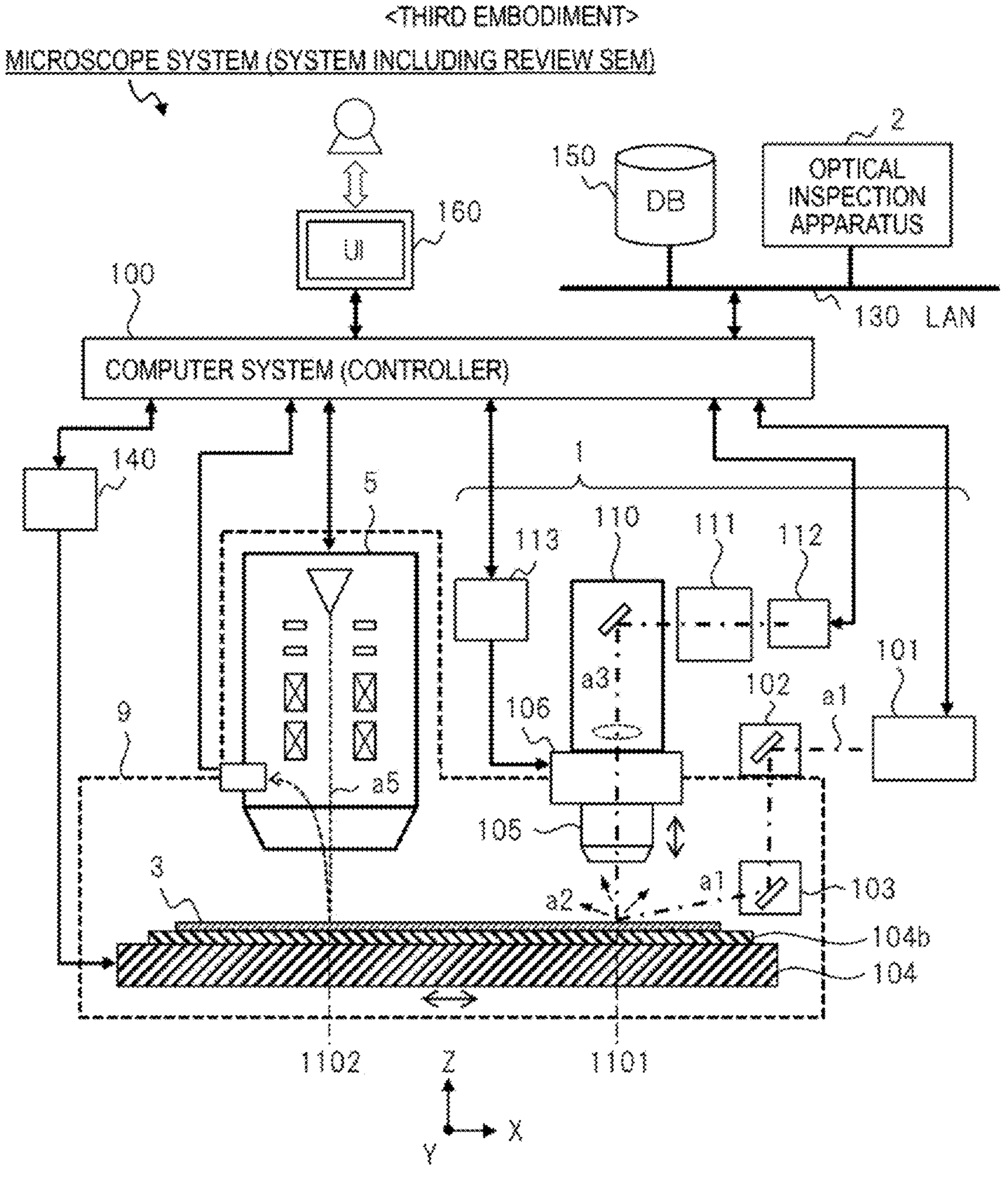

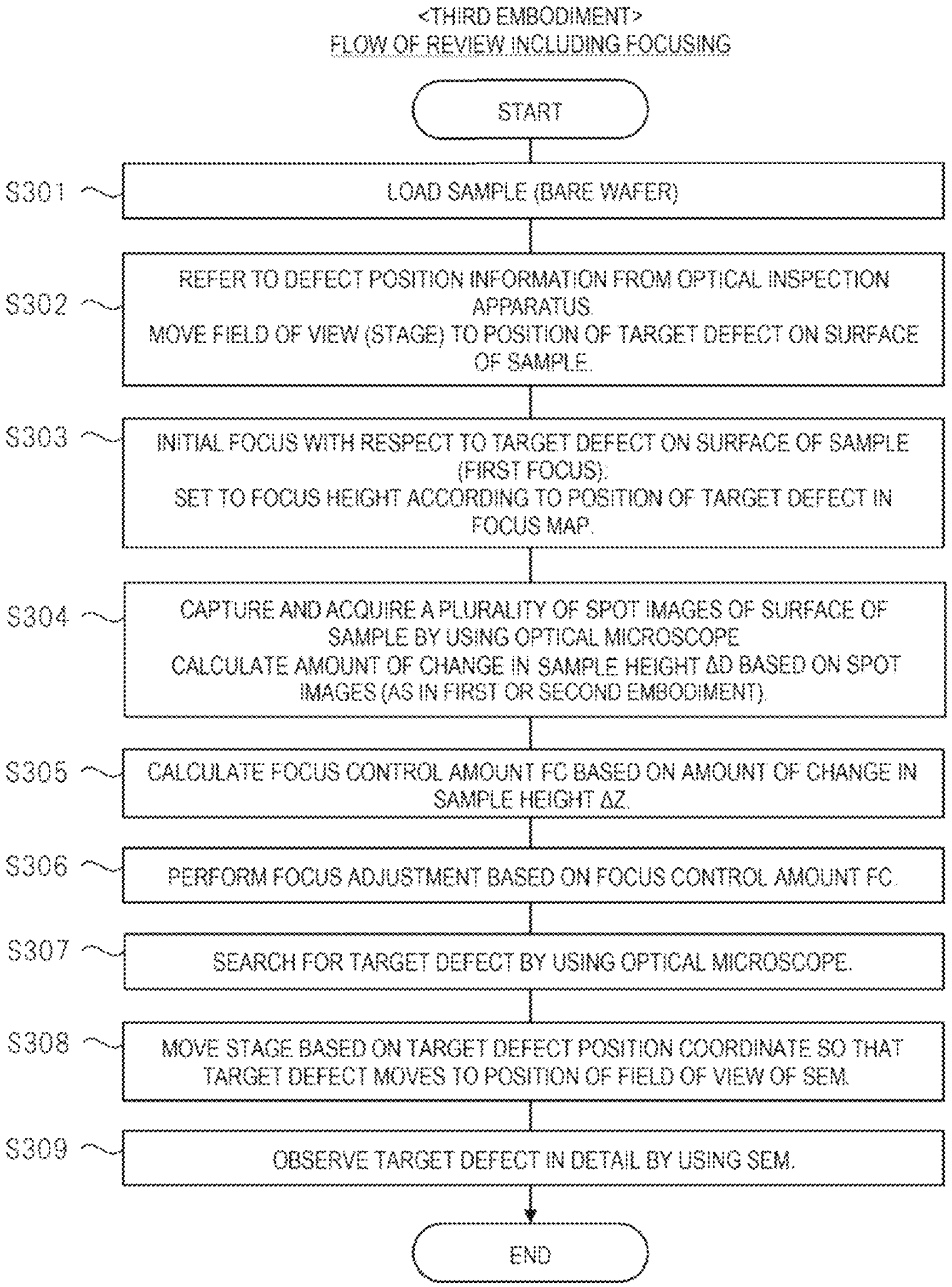

[FIG. 12]

START

S301 LOAD SAMPLE (BARE WAFER)

S302 REFER TO DEFECT POSITION INFORMATION FROM OPTICAL INSPECTION APPARATUS. MOVE FIELD OF VIEW (STAGE) TO POSITION OF TARGET DEFECT ON SURFACE OF SAMPLE.

S303 INITIAL FOCUS WITH RESPECT TO TARGET DEFECT ON SURFACE OF SAMPLE (FIRST FOCUS). SET TO FOCUS HEIGHT ACCORDING TO POSITION OF TARGET DEFECT IN FOCUS MAP.

S304 CAPTURE AND ACQUIRE A PLURALITY OF SPOT IMAGES OF SURFACE OF SAMPLE BY USING OPTICAL MICROSCOPE. CALCULATE AMOUNT OF CHANGE IN SAMPLE HEIGHT $\Delta D$ BASED ON SPOT IMAGES (AS IN FIRST OR SECOND EMBODIMENT).

S305 CALCULATE FOCUS CONTROL AMOUNT FC BASED ON AMOUNT OF CHANGE IN SAMPLE HEIGHT $\Delta Z$.

S306 PERFORM FOCUS ADJUSTMENT BASED ON FOCUS CONTROL AMOUNT FC.

S307 SEARCH FOR TARGET DEFECT BY USING OPTICAL MICROSCOPE.

S308 MOVE STAGE BASED ON TARGET DEFECT POSITION COORDINATE SO THAT TARGET DEFECT MOVES TO POSITION OF FIELD OF VIEW OF SEM.

S309 OBSERVE TARGET DEFECT IN DETAIL BY USING SEM.

END

[FIG. 13]
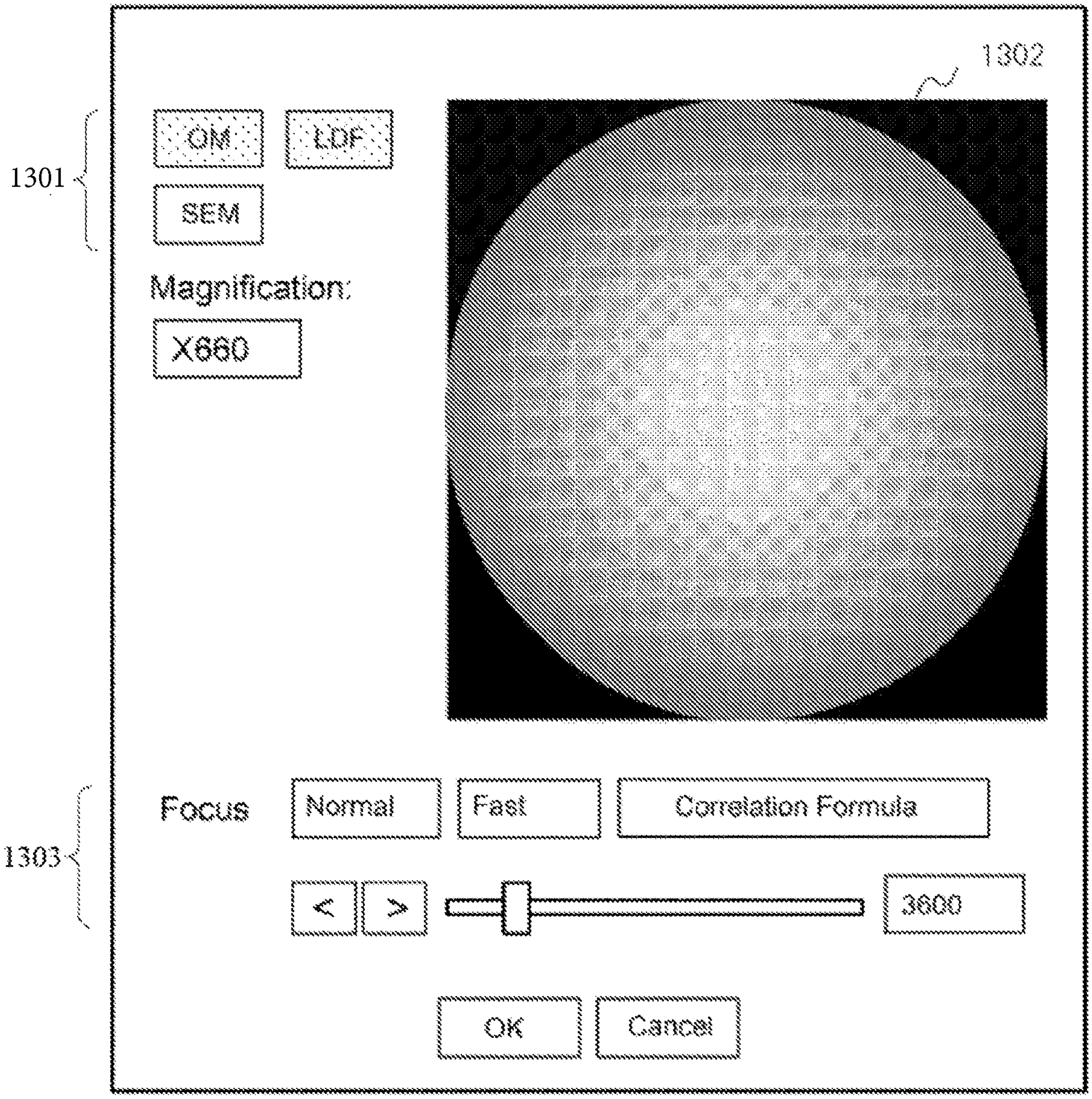

MICROSCOPE SYSTEM

TECHNICAL FIELD

The present disclosure relates to a technique of a microscope system such as an optical microscope.

BACKGROUND ART

In a process for manufacturing a semiconductor device, for example, there may be a foreign matter or a defect (sometimes collectively referred to as a defect) on a wafer surface, which may be a failure cause, and thus it is necessary to detect the defect. There are various reasons for occurrence of the defect. Examples of the defect include a defect in a circuit pattern shape, a short circuit, a void, a scratch and the like. With circuit pattern miniaturization of a semiconductor device, a high-accuracy and high-throughput detection is required for a relatively fine defect.

As a method related to defect detection and observation, a method for identifying a defect position on a surface of a sample using an optical inspection apparatus and observing the defect position using a microscope system such as a review SEM is known. The review SEM is an apparatus that includes, for example, a scanning electron microscope (SEM) and an optical microscope. It is possible to observe the surface of the sample in detail at a high magnification by using the SEM. By using the review SEM, a target defect is observed in detail from an image captured by the SEM, and a cause of occurrence of the defect and the like is estimated based on defect position information referenced from the optical inspection apparatus.

Examples of the related art related to the above microscope system includes PTL 1 and PTL 2.

PTL 1 discloses that an optical defect inspection apparatus or the like can detect a defect of an observation target and can surely put the defect of the observation target in a field of view of an electron microscope or the like. PTL 1 discloses that an optical microscope equipped with a dark field illumination unit inserts a spatial distribution optical element when observing a dark field.

PTL 2 discloses that a charged particle beam apparatus can accurately focus a mounted optical microscope. PTL 2 discloses that a polynomial approximation formula is created based on a focus map of the optical microscope measured in advance, and a control amount obtained by adding a difference between wafer height information at that time and wafer height information at the time of actual observation to the polynomial approximation formula is input as a focus control value.

CITATION LIST

Patent Literature

PTL 1: JP-A-2012-26733
PTL 2: JP-A-2012-146581

Technical Problem

According to an example of the related art such as PTL 1, when focusing on a sample surface, the optical microscope needs to calculate the focusing using a plurality of points on the sample surface, for example, patterns or defects for alignment based on judgment on a plurality of images. This method takes time for a calculation process, and thus it takes time for the focusing.

According to an example of the related art such as PTL 2, a focus map is created in advance by observing a sample provided with a pattern using an observation optical system. The optical microscope determines a focus height according to a position on the surface of the sample based on the focus map. According to this method, it is not possible to deal with a change in the focus height (in other words, sample height) due to a change over time, and it is necessary to periodically update the focus map. According to this method, a difference between the sample provided with a pattern and a sample provided without a pattern (for example, bare wafer) cannot be dealt with.

According to the example of the related art, when performing a positional alignment in a focus height direction, a microscope system may be provided with dedicated hardware such as an optical system or a sensor capable of measuring in a height direction. In such a case, there are also problems that the apparatus is expensive, and an occupation space is required for the hardware, which leads to an increase in the size of the apparatus.

In addition, for a review SEM, a positional alignment to a target defect on a surface of a sample is performed with reference to defect position information from an optical inspection apparatus. This positional alignment includes a positional alignment in a horizontal direction corresponding to the surface of the sample (sometimes described as alignment or the like), and a positional alignment of focus in a vertical direction and a height direction with respect to the surface of the sample (sometimes described as focusing, focus adjustment, or the like). In this case, a misalignment or a dissociation may occur between a coordinate system of the optical inspection apparatus and a coordinate system of the review SEM. Even when positioning is performed to a position indicated by the defect position information in the review SEM, it is not always possible to accurately position to the target defect position, and there may be a position misalignment in directions including the horizontal direction and height direction. In particular, regarding the focus height, since the sample height may vary, a position misalignment of the focus height may occur. Examples of reasons of the sample height variation include a case where the surface of the sample is tilted due to dust or the like intervening between a stage and the sample, a case where a thickness of the surface of the sample was not formed uniformly, and the like.

Therefore, it is necessary for the review SEM to correct the misalignment or the dissociation between the coordinate systems by performing a positional alignment to the target defect on the surface of the sample using, for example, the optical microscope. The review SEM needs to perform the positional alignment as accurately as possible to the target defect position so that the target defect is included and appears in the field of view (corresponding image) of the SEM.

According to the example of the related art, when performing the positional alignment to the target defect on the surface of the sample by using the optical microscope, it is necessary to search while moving the field of view (corresponding stage) such that the target defect is included and appears in the field of view. This search requires efforts of an operator and takes time, and thus throughput of the defect observation is reduced.

According to the example of the related art, it takes time and effort when a sample provided with a pattern is a target. However, the focusing or the like is possible by using an auto-focusing method based on determination of a plurality of images as described above, a method using a focus map as described above, or the like. The sample provided with a pattern is, for example, a sample in which a circuit pattern, a defect or the like that is a clue for alignment can be observed. On the other hand, a sample provided without a pattern may be a target, the focusing or the like as described above may be not possible, and the accuracy and throughput may be low even when the focusing or the like is possible. The sample provided without a pattern is a sample such as a bare wafer for which it is difficult to observe and detect a pattern (pattern according to a resolution of a microscope) that is a clue from a captured image.

SUMMARY OF THE INVENTION

An object of the disclosure is to provide a technique capable of suitably focusing on a surface of a sample with respect to a technique of the above microscope system.

Solution to Problem

A representative embodiment of the disclosure includes the following configuration. The microscope system according to the embodiment includes: an irradiation optical system configured to irradiate a surface of a sample on a stage with light from an oblique direction; an observation optical system configured to form an image of scattered light from the surface of the sample; a focus mechanism configured to change height positions of focuses of the irradiation optical system and the observation optical system with respect to the surface of the sample; and a computer system configured to control the irradiation optical system, the image forming optical system and the focus mechanism, and acquire an image from the observation optical system. The computer system is configured to, regarding the sample, acquire a first image in a first focus state at a first time point and a second image in a second focus state at a second time point, the first image and the second image have different focus heights, calculate a position of a spot pattern in the first image as a first spot position and calculate a position of a spot pattern in the second image as a second spot position, calculate an amount of change between the first spot position and the second spot position as an amount of change in spot position, calculate an amount of change in the height of the sample as an amount of change in sample height based on an incident angle in the oblique direction and the amount of change in spot position, and adjust the height positions of the focuses by using the amount of change in sample height so as to focus on the surface of the sample.

Advantageous Effect

According to a representative embodiment of the disclosure, it is possible to suitably focus on a surface of a sample with respect to a technique of the above microscope system. Other problems, configurations, and effects will be described in the column [Description of Embodiments].

BRIEF DESCRIPTION OF DRAWINGS

FIG. 1 shows a configuration of a microscope system according to a first embodiment of the disclosure.

FIG. 2 shows a configuration example of a computer system according to the first embodiment.

FIG. 3 shows an example of a dark field image in the first embodiment.

FIG. 5 shows calculation formulas of the focusing in the first embodiment.

FIG. 6 shows a flow including the focusing in the first embodiment.

FIG. 8 shows a flow including focusing in a microscope system according to a second embodiment of the disclosure.

FIG. 10 shows an example of a plot for creating a correlation formula in the second embodiment.

FIG. 11 shows a configuration of a microscope system according to a third embodiment of the disclosure.

FIG. 12 shows a flow including focusing in the third embodiment.

FIG. 13 shows an example of a GUI screen in the third embodiment.

DESCRIPTION OF EMBODIMENTS

Figures 4A, 4B, 4C:
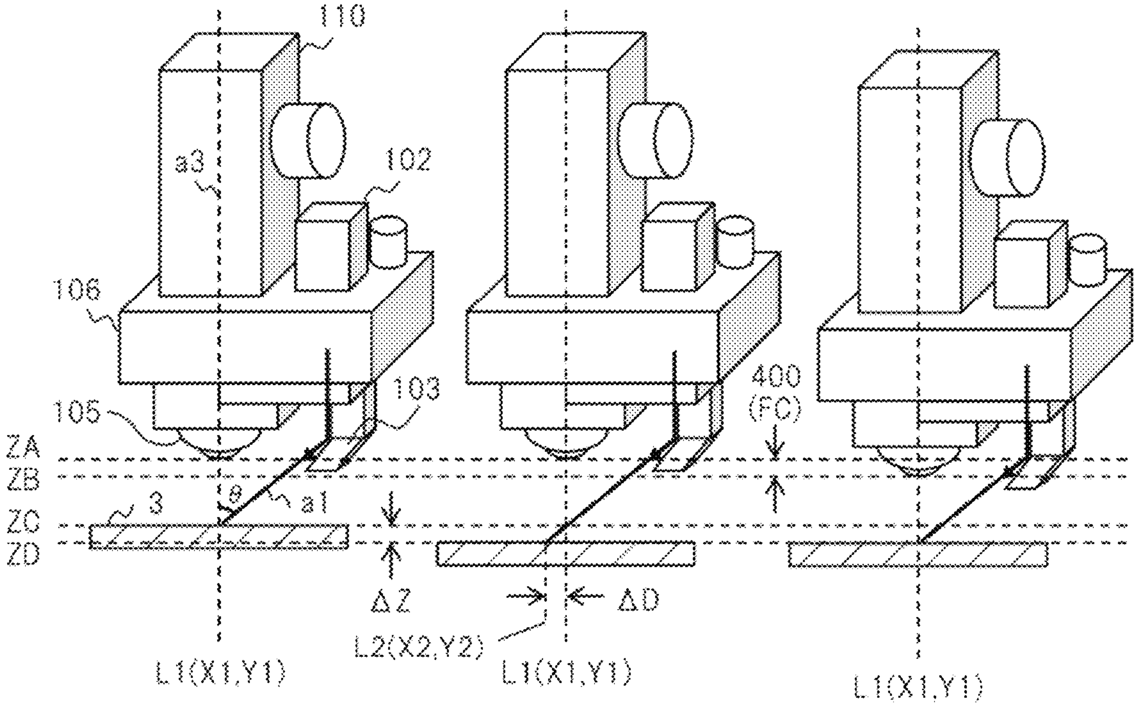
FIGS. 4A to 4F show schematic diagrams regarding a principle of focusing in the first embodiment.

Hereinafter, embodiments of the disclosure will be described in detail with reference to the drawings. In all the drawings, the same parts are denoted by the same reference numerals in principle, and a repeated description thereof will be omitted. In order to facilitate understanding, in the drawings, representations of respective components may not represent an actual position, size, shape, range, and the like.

For the purpose of description, when a process according to a program is described, the description may be made with reference to the program, a function, a processing unit and the like. However, primary hardware regarding the program, the function, the processing unit and the like is a processor, or a controller, a device, a computer, a system, or the like including the processor and the like. The computer executes a process according to a program read onto a memory while appropriately using resources such as the memory and a communication interface by the processor. Accordingly, the predetermined function, the processing unit and the like are achieved. The processor is constituted by, for example, a semiconductor device such as a CPU or a GPU. The processor is constituted by a device or a circuit capable of performing a predetermined calculation. The process is not limited to a software program process, and can be implemented by a dedicated circuit. FPGA, ASIC and the like can be applied to the dedicated circuit.

The program may be installed as data in a target computer in advance, or may be distributed and installed as data into the target computer from a program source. The program source may be a program distribution server on a communication network, and may be a non-transient computer-readable storage medium (for example, memory card). The program may be constituted by a plurality of program modules. A computer system is not limited to one device, and may be constituted by a plurality of devices. The computer system may be constituted by a client server system, a cloud computing system, or the like. For various types of data and information, a structure such as a table or a list can be applied, and the structure is not limited thereto. Identification information on various components can be replaced with an identifier, an ID, a name, a number, or the like.

First Embodiment

A microscope system according to the first embodiment will be described with reference to FIGS. 1 to 7. The microscope system according to the first embodiment is a system provided with a laser dark field microscope as an optical microscope. According to the first embodiment, a sample 3 to be observed is a sample provided without a pattern, for example, a bare wafer.

The microscope system according to the first embodiment shown in FIG. 1 and the like determines a spot pattern of scattered light a2 from a surface of the sample 3 based on an image captured by an optical microscope 1 when focusing on the surface of the sample 3. This microscope system calculates an amount of change in sample height based on an amount of change in spot position, and performs a focus adjustment corresponding to the amount of change in sample height.

[Microscope System]

FIG. 1 shows a configuration of the microscope system according to the first embodiment. The microscope system according to the first embodiment is a system provided with a laser dark field microscope as the optical microscope 1, and includes a computer system 100 as a controller. As shown in FIG. 2 to be described later, the computer system 100 is constituted by, for example, a control PC. A user who is an operator operates the computer system 100 to use the optical microscope 1.

The optical microscope 1 includes a laser light source 101 that is a dark field illumination unit, a laser axis adjustment mirror 102, an irradiation mirror 103, a stage 104, an objective lens 105, a piezo stage 106 that is a focus stage, a microscope body 110, a spatial filter 111, a camera 112 that is an image capture device, a piezo stage controller 113 that is a focus drive control unit, and the computer system 100 that is a controller. These components are interconnected through signal lines and communications.

The stage 104 is a sample stage on which the sample 3 is placed, held, and moved. For the purpose of description, (X, Y, Z) shown in FIG. 1 may be used as a representation of a coordinate system and directions. The X and Y directions are two orthogonal directions constituting a horizontal direction and a radial direction corresponding to the stage 104 and the surface of the sample 3. The Z direction is a vertical direction and a height direction with respect to the stage 104 and the surface of the sample 3. The stage 104 is a stage that can move in at least the X and Y directions based on a drive from a stage drive unit (not shown).

An irradiation optical system includes the laser light source 101, the laser axis adjustment mirror 102 and the irradiation mirror 103.

The laser light source 101 is a mechanism for emitting laser light a1. The laser light source 101 includes, for example, a laser oscillator capable of emitting the laser light a1 that is at least one of a visible light laser, an ultraviolet light laser, and a vacuum ultraviolet light laser. For the laser oscillator, either a continuous wave laser or a pulsed laser can be applied. The laser light source 101 includes, for example, an optical filter for adjusting an intensity of the laser light, a wavelength plate for adjusting a polarization direction of the laser light, and a group of diaphragm lenses. Accordingly, an irradiation region of the laser light a1 on the surface of the sample 3 can be adjusted, and a shape, a size and the like of a spot pattern of the laser light a1 can be adjusted.

As shown in FIG. 1, the laser axis adjustment mirror 102 reflects the laser light a1 emitted from the laser light source 101, for example, in the horizontal direction by a mirror and guides the laser light a1 to the irradiation mirror 103 in a chamber (not shown) at the lower side in the Z direction. The laser axis adjustment mirror 102 can adjust a direction of an optical axis of the laser light a1 by changing the direction of the mirror based on a drive control of the piezo stage controller 113.

The irradiation mirror 103 reflects the laser light a1 from the laser axis adjustment mirror 102 onto the surface of the sample 3 on the stage 104. An incident angle of the laser light a1 from the irradiation mirror 103 to the surface of the sample 3 is set to a laser light incident angle θ to be described later. The irradiation mirror 103 is a mechanism that moves integrally with the objective lens 105 so that the laser light a1 can be radiated in a field of view of the objective lens 105 even when the objective lens 105 moves up and down in the Z direction with a focus drive by the piezo stage 106. The mechanism of the irradiation mirror 103 is not limited thereto, any mechanism may be used as long as it can change an irradiation position of the laser light a1 in the field of view of the objective lens 105, and the mechanism may be a mechanism that can move independently of the objective lens 105. The controller 100 may control heights of the objective lens 105 and the irradiation mirror 103.

The objective lens 105 is arranged above the stage 104 and below the microscope body 110, and injects and collects the scattered light a2 from the surface of the sample 3 based on the laser light a1 on an axis a3 that is an observation axis of the microscope body 110. Incident light collected by the objective lens 105 is injected to the microscope body 110. The microscope body 110 includes an image forming optical system, and guides the incident light from the objective lens 105 to the spatial filter 111 through the image forming optical system. The image forming optical system includes, for example, a plurality of lenses and mirrors.

A focus mechanism is a mechanism that includes the piezo stage 106 that is a focus stage, the objective lens 105, the laser axis adjustment mirror 102, the irradiation mirror 103 and the like, and is capable of controlling and adjusting the focus.

The piezo stage 106 as a focus stage corresponds to a focus drive unit constituted by a piezo element. The piezo stage 106 integrally moves the objective lens 105 and the irradiation mirror 103 up and down in the Z direction based on the drive control of the piezo stage controller 113. Accordingly, the heights of the focus (corresponding distances and positions) of the objective lens 105 and the irradiation mirror 103 with respect to the surface of the sample 3 on the stage 104 can be adjusted. Since a positional relation between the objective lens 105 and the irradiation mirror 103 in a focus control is maintained constant, the incident angle of the laser light a1 with respect to the surface of the sample 3 is maintained constant as the laser light incident angle θ. The focus stage is not limited to the piezo stage, and may be configured by other techniques.

The spatial filter 111 is a device that performs spatial filtering so that regarding the scattered light injected to the camera 112 from the image forming optical system of the microscope body 110, a defect portion can be easily seen in a spot image.

The camera 112 is an image capture device constituted by a solid-state image capture device or the like. The camera 112 captures an optical image that is processed by the spatial filter 111 and outputs the optical image to the controller 100. The components such as the camera 112, the piezo stage controller 113 and the controller 100 are connected by signal lines or communication lines.

The piezo stage controller 113 drives and controls the laser axis adjustment mirror 102, the piezo stage 106 and the like based on a control of the controller 100. The controller

100 adjusts a focus height by a focus control amount FC based on an amount of change in sample height ΔZ to be described later so as to focus on the surface of the sample 3 by feedback-controlling the piezo stage 106 using the piezo stage controller 113.

In the optical microscope 1 according to the first embodiment, for the arrangement of the components and for the objective lens 105 to suitably collect the scattered light a2 from the surface of the sample 3, as shown in FIG. 1, the direction of irradiation of the laser light a1 with respect to the surface of the sample 3 is an oblique direction with respect to the vertical direction (Z direction) of the surface of the sample 3.

As a supplement, a configuration example of the laser axis adjustment mirror 102 is as follows. The laser axis adjustment mirror 102 includes a first-axis rotation mirror and a second-axis rotation mirror inside as a two-axis rotation mirror mechanism. The first-axis rotation mirror rotates around a first axis, and the second-axis rotation mirror rotates around a second axis orthogonal to the first axis. The laser axis adjustment mirror 102 changes and adjusts rotation angles of the two mirrors based on the drive control of the piezo stage controller 113. Regarding the laser light a1 from the laser light source 101, a reflection direction to the irradiation mirror 103 is finely adjusted according to states of the mirrors of the two-axis rotation mirror mechanism. Accordingly, based on the laser light a1, and via the reflection on the irradiation mirror 103, the irradiation position of the laser light a1 with respect to the surface of the sample 3 (corresponding X-Y plane) can be adjusted two-dimensionally, that is, in the X direction and the Y direction.

[Computer System]

FIG. 2 shows a configuration example of the computer system 100 that is the controller in FIG. 1. The computer system 100 includes a control PC, and an input device 205 and a display device 206 connected to the control PC. The user as an operator operates the input device 205 while looking at a display screen of the display device 206 so as to use the optical microscope 1.

The control PC of the computer system 100 includes a processor 201, a memory 202, a communication interface device 203, an input and output interface device 204, buses connecting these components to each other, and the like. The input device 205 such as a keyboard and a mouse, and the display device 206 such as a liquid crystal display are connected to the input and output interface device 204. The communication interface device 203 is connected to the components such as the piezo stage controller 113 and the camera 112 of FIG. 1 by a predetermined communication interface, and inputs or outputs or communicates signals and data between the components. The communication interface device 203 is connected to a predetermined communication network 130, for example, a LAN, and can communicate with an external device through the LAN. Examples of the external device include an optical inspection apparatus 2, a server that holds a database (DB) 150, and the like. Alternatively, the examples include a manufacturing execution system (MES) that manages a process for manufacturing. The optical inspection apparatus 2 is an apparatus that specifies the defect position on the sample 3, and provides defect position information and the like. The DB 150 stores various types of data related to the sample 3, the process for manufacturing, and the like.

The processor 201 is constituted by, for example, a CPU, a ROM, and a RAM, and constitutes the controller. The processor 201 achieves the function and processing units of the computer system 100 based on the software program process. The function in the first embodiment includes a function for adjusting the focusing. The processor 201 displays a screen including a graphical user interface (GUI) on the display screen of the display device 206.

The memory 202 is constituted by a non-volatile storage device and the like, and stores various types of data and information used by the processor 201 or the like. The memory 202 stores a control program 211, setting information 212, image data 213, data for positional alignment 214, defect observation data 215, and the like. The control program 211 is a computer program for achieving the function. The setting information 212 includes setting information on the function of the control program 211 and user setting information. Examples of the setting information 212 include information such as a unit amount for control and a threshold value to be described later. The image data 213 is data of an image captured by the camera 112 and data obtained by processing the image. The data for the positional alignment 214 relates to various types of data related to a positional alignment process including the alignment and the focusing, and includes information such as an amount of change in sample height ΔZ to be described later. The defect observation data 215 is data including, for example, the defect position information referred to from the optical inspection apparatus 2, and information on the defect observed by the optical microscope 1.

[Dark Field Image]

As an image captured by the camera 112 in the optical microscope 1 as the laser dark field microscope of FIG. 1, FIG. 3 shows an example of the dark field image based on the scattered light a2 of the laser light a1 on the surface of the sample 3 that is a bare wafer. As shown in FIG. 3, the spot pattern based on the scattered light a2 is acquired as a substantially circular spot pattern in the image. In detail, this spot pattern is a pattern that changes as a gradation from light (white) to dark (black) from the center to the outer circumference as shown in FIG. 3. For processing, the computer system 100 may handle a spot pattern having a substantially circular region as in an example of the spot pattern to be described later by binarization from an image that is such a multi-valued image.

As described above, the laser light a1 is radiated from the oblique direction with respect to the surface of the sample at the laser light incident angle θ, and has an energy distribution of the laser light a1 radiated at the surface of the sample 3. In the first embodiment, the irradiation of the laser light a1 by the laser light source 101 is controlled such that the shape of the spot pattern is substantially circular in an image of the field of view corresponding to the surface of the sample 3.

An example of the image of FIG. 3 is an image in which no target defect appears. Since the sample 3 as a target is a bare wafer, when a bright portion (substantially circular region) is observed as the spot pattern in the image of FIG. 3, a fine surface structure can be observed in detail, and a clear pattern that is effective for the positional alignment cannot be observed.

[Focusing-Principle]

FIG. 4 is a schematic diagram regarding the principle of the focusing (in particular, calculation of the amount of change in sample height ΔZ) in the first embodiment. FIGS. 4A to 4C in FIG. 4 show positional relations between a part including the laser axis adjustment mirror 102, the irradiation mirror 103, the objective lens 105, the piezo stage 106, and the microscope body 110, and the sample 3 on the stage 104 (not shown) in FIG. 1 in the Z direction.

The height of the sample 3 on the stage 104 can change due to any reasons. Examples of the reasons include, for example, a case where the surface of the sample 3 is tilted due to dust or the like intervening between the stage 104 and the sample 3, a case where the thickness of the surface of the sample 3 was not formed uniformly, and a case of a distribution of height differences depending on the positions in the horizontal directions (X, Y directions) on the surface of the sample 3.

FIG. 4A in FIG. 4 shows a first focus state. In the first focus state, a height position of the surface of the sample 3 is at a first height position ZC, and a height position of a top portion of the objective lens 105 is at a first height position ZA. A position L1 (X1, Y1) is an observation target position on the axis a3 of the objective lens 105 and the microscope body 110. In an example in the first focus state, the focus is on the height position of the surface of the sample 3 ("focused state"), and the laser light a1 is radiated to the position L1 on the surface of the sample 3. The laser light incident angle θ is a constant value.

FIG. 4B in FIG. 4 shows a second focus state. In the second focus state, the height of the sample 3 changes from the first focus state of FIG. 4A. In the second focus state, the focus is not on the height position of the surface of the sample 3. In the second focus state, a height position of the objective lens 105 is at the first height position ZA as in FIG. 4A, and the height position of the sample 3 is at a second height position ZD. A difference between the first height position ZC and the second height position ZD of the sample 3 is shown by the amount of change in sample height ΔZ. The irradiation position of the laser light a1 on the surface of the sample 3 misaligns from the position L1 and is indicated by a position L2 (X2, Y2). The misalignment between the position L1 and the position L2 is shown as an amount of change in spot position ΔD.

FIG. 4C of FIG. 4 shows a third focus state, which is a target and an effect to be achieved by the function in the first embodiment, and shows a state in which the focus is on the height position of the surface of the sample 3 and the laser light a1 is radiated to the position L1 on the surface of the sample 3. In the third focus state, due to a focus control based on a focus control amount 400, the height positions of the objective lens 105 and the irradiation mirror 103 are changed from the first height position ZA to a second height position ZB. A difference between the first height position ZA and the second height position ZB is the focus control amount 400, the difference is a distance corresponding to a focus control amount FC to be described later. In the optical microscope 1 of FIG. 1, during the focus control, the height position of the irradiation mirror 103 also changes in the Z direction integrally with the objective lens 105 in this manner.

Figure 4D:
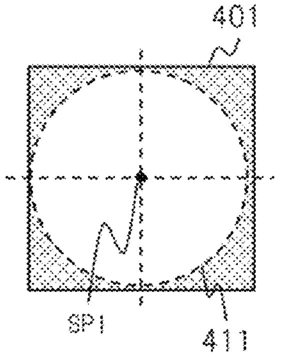
Figure 4E:
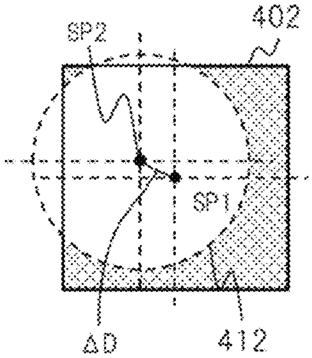
Figure 4F:
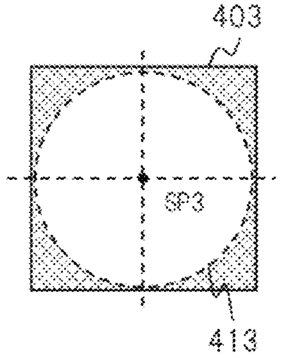

FIGS. 4D to 4F shown on the lower side of FIG. 4 show examples of the spot image that is an image captured by the camera 112, and these examples correspond to the focus states of FIGS. 4A to 4C on the upper side of FIG. 4, respectively. The images have an image region in an X-Y plane corresponding to the field of view. Here, image contents are schematically shown as a binarized region of a white region corresponding to a bright color portion of a laser spot and a dot pattern region corresponding to a dark color portion of background.

An image 401 of FIG. 4D is a first spot image in the first focus state of FIG. 4A. When the focus is on the surface of the sample 3, such an image is acquired. The image 401 is captured in a state where a center point of a circular spot pattern 411 (shown as a spot position SP1) is aligned with a center point of a rectangle-shaped image region corresponding to the field of view. In other words, the spot pattern 411 is a laser spot. A peak of brightness of a spot due to the scattered light a2 appears at a center position of the image 401 in the field of view.

An image 402 of FIG. 4E is a second spot image in the second focus state of FIG. 4B. Since the focus is not on the position L1 as a target on the surface of the sample 3, the image 402 in which the spot pattern misaligns and is captured in this manner is acquired. The image 402 is captured in a state where the center point (shown as a spot position SP2) of the circular spot pattern 412 misaligns from the center point (spot position SP1 in FIG. 4D) of the rectangle-shaped image region corresponding to the field of view, and only a portion of the spot pattern 412 is captured in a rectangle. When the change in height of the sample 3 is further large, an image content in which the spot pattern is not captured is acquired. A difference between the spot position SP1 of FIG. 4D and the spot position SP2 of FIG. 4E is the amount of change in spot position ΔD.

An image 403 of FIG. 4F is a third spot image in the third focus state of FIG. 4C. As a result of adjustment such that the focus is on the position L1 on the surface of the sample 3, the image 403 having the same content as that of the image 401 of FIG. 4D is acquired in this manner. The image 403 is captured in a state where a center point of a circular spot pattern 413 (shown as a spot position SP3) is aligned with the center point of the rectangle-shaped image region corresponding to the field of view.

As in the examples described above, when the height of the sample 3 changes with respect to the observation optical system, the spot position of the spot pattern changes in the captured image. As described later, the optical microscope 1 according to the first embodiment uses the image 401 in the first focus state as shown in FIG. 4D and the image 402 in the second focus state as shown in FIG. 4E to calculate the amount of change in sample height ΔZ based on the amount of change in spot position ΔD. The optical microscope 1 performs the focus adjustment so as to feed back the amount of change in sample height ΔZ to the focus height. Accordingly, it is possible to achieve the state where the focus is on the position L1 as a target on the surface of the sample 3 as shown in FIG. 4C.

The disclosure is not limited to the example of the relation between FIGS. 4A and 4B such as the focus, when two or more spot images in two or more focus states are acquired, which have different sample height states and focus height states, the optical microscope 1 can similarly calculate the amount of change in sample height ΔZ for the focusing.

[Basic Calculation Formula]

Based on the principle of FIG. 4, FIG. 5 shows relations between the amount of change in sample height ΔZ and the amount of change in spot position ΔD in the optical microscope 1 according to the first embodiment, and calculation formulas for the amount of change in sample height ΔZ. As shown in FIG. 4 described above, when the focus control is performed, as the height positions of the objective lens 105 and the irradiation mirror 103 change with respect to the surface of the sample 3, the spot position of the spot pattern in the image captured by the camera 112 also changes. That is, the amount of change in spot position ΔD also occurs in accordance with the amount of change in sample height ΔZ. The relation of this change is shown by the relation using tan θ as shown in FIG. 5. The angle at which the laser light a1 from the irradiation mirror 103 is incident onto the surface of the sample 3 is the laser light incident angle θ. Here, the laser light incident angle θ is an angle from an axis (corresponding to the axis a3 in FIG. 1) in the vertical direction and the height direction with respect to the surface of the sample 3. An angle φ is an angle (90 degrees−θ) from the surface of the sample 3, is an acute angle (low elevation angle), and is, for example, φ≈10 degrees.

When the laser light incident angle θ is constant and the height of the sample 3 on the stage 104 changes from, for example, the first height Z1 to the second height Z2, in other words, when the focus height changes, the difference between the two heights is set as the amount of change in sample height ΔZ (ΔZ=Z1−Z2) in the Z direction. In such a case, the irradiation position (corresponding spot position) of the laser light a1 on the surface of the sample 3 changes from the position L1 (X1, Y1) to the position L2 (X2, Y2). A difference between the two positions is set as the amount of change in spot position ΔD (ΔD=L1−L2=(ΔX, ΔY)=(X1−X2, Y1−Y2).

Thus, as shown in FIG. 5, the following calculation formulas are considered by using tan.

$$\tan\theta=\Delta D/\Delta Z \qquad \text{Formula 1:}$$

$$\Delta Z=\Delta D/\tan\theta \qquad \text{Formula 2:}$$

That is, when the optical microscope 1 acquires the laser light incident angle θ and the amount of change in spot position ΔD based on the image captured by the camera 112, the optical microscope 1 can calculate the amount of change in sample height ΔZ for the focusing (in other words, the amount of change in focus height from a position in the focused state) based on the above calculation formulas.

[Flow (1)]

FIG. 6 shows a processing flow that includes a focus height calculation for the focusing in the microscope system of the first embodiment. This flow includes steps S101 to S110. In step S101, the optical microscope 1 loads a bare wafer including an observation target defect, which is the sample 3 as an observation target, onto the stage 104 in the chamber, and moves the stage 104 such that a target defect position is directly below the objective lens 105 on the axis a3.

In step S102, the operator operates the optical microscope 1 to observe the target defect on the surface of the sample 3. The optical microscope 1 irradiates the surface of the sample 3 with the laser light a1 from the laser light source 101. The optical microscope 1 forms an image of the scattered light a2 from the surface of the sample 3 using the objective lens 105, and acquires the image captured by the camera 112. Here, in an image corresponding to the field of view of the optical microscope 1, the target defect on the surface of the sample 3 may be observed or may not be observed. When the target defect is observed, there is no need to perform a positional alignment including the focusing separately. When the target defect is not observed, the optical microscope 1 performs the positional alignment including the focusing as follows.

The controller 100 of the optical microscope 1 integrally moves the objective lens 105 and the irradiation mirror 103 in the Z direction by driving and controlling the piezo stage 106 based on the piezo stage controller 113. The controller 100 adjusts the two axes of the laser axis adjustment mirror 102 based on the piezo stage controller 113 to adjust the irradiation position of the laser light a1 on the surface of the sample 3. Accordingly, first, as a provisional initial focus, a first focus for adjusting the focus height to the surface of the sample 3 is performed. This state is set as the first focus state. The first focus state has a first sample height, in other words, a first focus height. According to this first focus, it is preferable to perform adjustment such that the spot pattern as a target is approximately at the center position in a dark field image, and at this point, an accurate focusing may not be possible. After an adjustment in the first focus, the controller 100 fixes a state of the two axes of the laser axis adjustment mirror 102 without changing the state. That is, during the focusing, the laser light incident angle θ is kept constant.

In step S103, the optical microscope 1 radiates the laser light a1 from the laser light source 101, whereby the optical microscope 1 acquires an image by capturing the surface of the sample 3 in the field of view in the first focus state as a first image. In other words, the first image is a first spot image in which a first spot pattern based on the scattered light a2 of the laser light a1 is captured.

In step S104, the optical microscope 1 controls the focus mechanism to be in the second focus state having a height different from that in the first focus state. This state is set as the second focus state. The second focus state has a second sample height, in other words, a second focus height.

In step S105, the optical microscope 1 acquires an image by capturing an image of the surface of the sample 3 in the field of view in the second focus state as a second image. In other words, the second image is a second spot image in which a second spot pattern based on the scattered light a2 of the laser light a1 is captured.

In step S106, the optical microscope 1 calculates the amount of change in spot position ΔD based on the first image and the second image. In such a case, the optical microscope 1 can calculate the amount of change in spot position ΔD based on, for example, distances between the positions of the spot patterns in the images and the center point of the image region in the field of view.

In step S107, the optical microscope 1 calculates the amount of change in sample height ΔZ (in other words, the amount of change in focus height) by using the calculation formulas of FIG. 5 described above based on the amount of change in spot position ΔD and the laser light incident angle θ.

In step S108, the optical microscope 1 calculates the focus control amount FC based on the amount of change in sample height ΔZ. The focus control amount FC is expressed by a parameter such as a voltage when the piezo stage 106 is driven.

In step S109, the optical microscope 1 adjusts the focus height such that the focus is on the surface of the sample 3 by controlling the focus mechanism based on the focus control amount FC. In such a case, the controller 100 sends an instruction to the piezo stage controller 113 and controls the piezo stage controller 113, and drives and controls the piezo stage 106 by the focus control amount FC using the piezo stage controller 113. In accordance therewith, the piezo stage 106 integrally moves the objective lens 105 and the irradiation mirror 103 in the Z direction, and sets the focus height by which the focus is on the surface of the sample 3.

In step S110, the operator observes the target defect on the surface of the sample 3 using the optical microscope 1.

[Calculation of Amount of Change in Spot Position]

FIG. 7 shows an example of a method or process of calculating the amount of change in spot position ΔD based on a plurality of spot images regarding the above step S106 in the first embodiment. As an example, it is assumed that a first spot image 701 (image 401 in FIG. 4) at the first height in the first focus state of FIG. 7A in FIG. 7 and a second spot image 702 (image 402 in FIG. 4) at the second height in the second focus state of FIG. 7B in FIG. 7 are acquired. As described above, it is assumed that the first focus state is a state in which the focus is achieved, and the second focus state is a state in which the focus is not achieved (defocus state), the disclosure is not limited thereto. In such a case, the optical microscope 1 calculates the amount of change in spot position ΔD from these two images as follows.

Figure 7A:
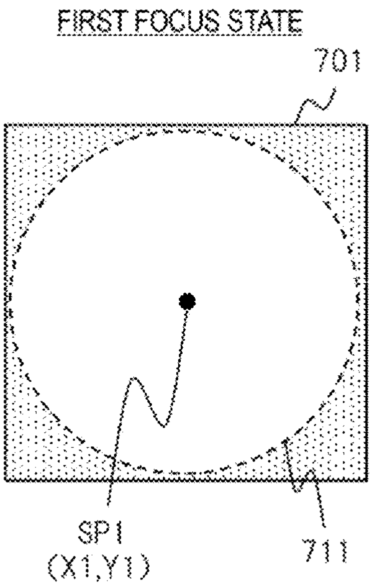
FIGS. 7A to 7D show examples of a process of calculating an amount of change in spot position in the first embodiment.
Figure 7B:
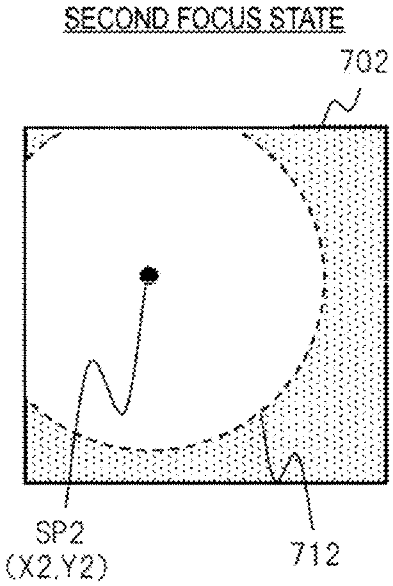

The first spot image 701 of FIG. 7A shows a case where a spot gravity position coordinate (X1, Y1) as the first spot position SP1 of a circular first spot pattern 711 coincides with the center point of the image in the field of view. The second spot image 702 of FIG. 7B shows a case where a spot gravity position coordinate (X2, Y2) as the second spot position SP2 of a circular second spot pattern 712 misaligns from the center point of the image in the field of view. A reference position of the image corresponding to the field of view is set to be the center point of the rectangle-shaped image region. As compared to the first spot image 701, in the second spot image 702, it is assumed that the amount of change in sample height ΔZ corresponding to the amount of change in focus height is unknown.

First, the optical microscope 1 calculates a gravity position, which is the first spot position SP1 of the first spot pattern 711, based on the first spot image 701 in the first focus state of FIG. 7A by image binarization, and acquires the gravity position as a position coordinate value (X1, Y1).

The optical microscope 1 acquires a gravity position, which is the second spot position SP2 of the second spot pattern 712, based on the second spot image 702 having the unknown amount of change in sample height ΔZ in the second focus state of FIG. 7B as a position coordinate value (X2, Y2). At this time, as in the example of FIG. 7B, the second spot pattern 712 may have a shape (that is, an arc shape) that is partially cut out from a circle since it does not fit within the rectangle-shaped image region.

Figure 7C:
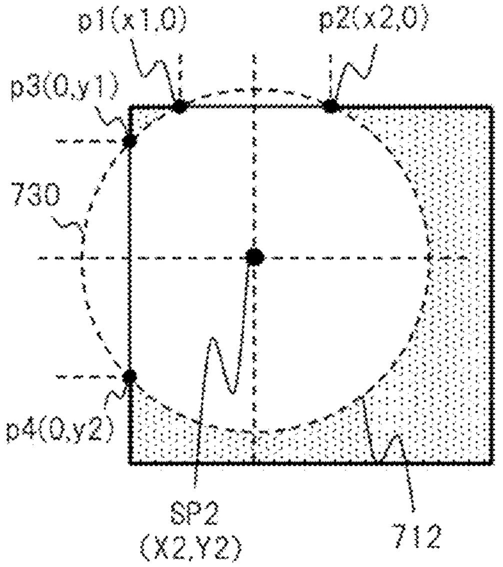

In such a case, as shown in FIG. 7C in FIG. 7, the optical microscope 1 calculates position coordinates of boundaries or intersections (for example, points p1 to p4) between the rectangle-shaped image region and a portion of the spot pattern 712 that remains as an arc shape. The optical microscope 1 defines a virtual circle (for example, a virtual circle 730) from position coordinates (points p1 to p4) of the boundaries or intersections. The virtual circle 730 is obtained by estimating and complementing the shape of the spot pattern 712 as a circle including an arc-shaped portion outside the rectangle-shaped image region. Further, the optical microscope 1 calculates a gravity position coordinate of the virtual circle 730, and sets the gravity position coordinate as the second spot position SP2=(X2, Y2).

Figure 7D:
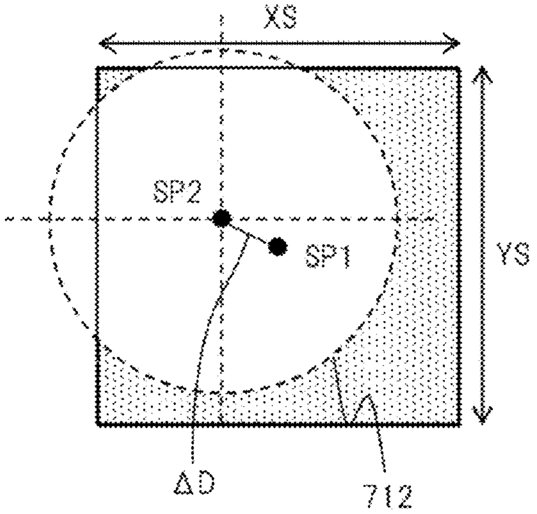

As in the image of FIG. 7D, the optical microscope 1 calculates the amount of change in spot position ΔD according to $\sqrt{\{(X2-X1)^2+(Y2-Y1)^2\}}$, the amount of change in spot position ΔD is a distance between the first spot position SP1 (X1, Y1) and the second spot position SP2 (X2, Y2) acquired as described above. The amount of change in spot position ΔD is acquired in a unit of the number of pixels in the image. The size (for example, a vertical side length YS and a horizontal side length XS, a unit of distance such as μm) of the field of view (corresponding image) is determined in advance. Therefore, the optical microscope 1 converts the amount of change in spot position ΔD in the unit of the number of pixels acquired as described above into the unit of distance such as μm based on the size and the like. The optical microscope 1 can calculate the amount of change in sample height ΔZ by using the amount of change in spot position ΔD in the unit of distance based on the calculation formulas described above.

[Effects (1)]

As described above, according to the microscope system of the first embodiment, the focusing on the surface of the sample can be suitably achieved. According to the first embodiment, since the amount of change in sample height ΔZ is calculated based on the spot image, the focusing can be performed with high accuracy, and it is also easy to observe a relatively fine defect.

Further, according to the first embodiment, no focusing based on determination on a plurality of images as in examples of the related art is necessary, and a focusing at high speed is possible with less effort and time than that of the related art, and throughput of an observation operation can be increased.

According to the first embodiment, since a height measurement (corresponding focusing) using the optical microscope 1 is possible, it is not necessary to include dedicated hardware for height measurement as in the examples of the related art, and an apparatus can be achieved at low cost and in a reduced space.

In addition, the first embodiment may define the height measurement, for example, as a flow in which the focusing is performed by the above-mentioned method every time immediately before observing a sample. Accordingly, according to the first embodiment, even when the focus map is used as described in the above-mentioned problems, it is not necessary to consider an influence of misalignment over time or the like, and an update operation of the focus map is also unnecessary or can be reduced.

In addition, according to the first embodiment, even when a sample provided without a pattern such as a bare wafer (sample in which a pattern that is a clue for focusing is difficult to be observed) is used as a target, the focusing can be suitably performed.

Regarding the implementation of the function for the above-mentioned focusing, the first embodiment also describes the implementation as software in a computer system.

Second Embodiment

A microscope system according to the second embodiment will be described with reference to FIG. 8 and subsequent figures. A basic configuration of the second embodiment is the same as that of the first embodiment. Hereinafter, configuration portions different from those of the first embodiment in the second embodiment will be mainly described. The second embodiment corresponds to a more detailed configuration example using the first embodiment as a basic configuration, and in particular, the second embodiment shows a method using a correlation formula as a method for calculating the amount of change in sample height ΔZ based on the above-mentioned amount of change in spot position ΔD.

[Flow (2)]

FIG. 8 shows a flow that includes the focusing based on the optical microscope 1 in the second embodiment. This flow includes steps S201 to S209. In step S201, the optical microscope 1 loads an unknown bare wafer, which is the sample 3 as a target, in the chamber, and moves a stage 3 such that the field of view is positioned at the target defect on the surface of the sample 3.

In step S202, the operator observes the surface of the sample 3 using the optical microscope 1. The optical microscope 1 irradiates the surface of the sample 3 with the laser light a1 from the laser light source 101, and acquires an image captured by the camera 112. The operator confirms that a spot pattern is visible near the center of the image. The optical microscope 1 performs the first focus for adjusting the focus height to the surface of the sample 3 as the provisional initial focus based on an operation by the operator. Here, when the target defect can be observed in the image, it is possible to perform the focusing based on a pattern of the target defect, and thus it is not necessary to separately perform the focusing (flows after step S203). When the target defect cannot be observed in the image, the optical microscope 1 performs the focusing as follows. For example, the operator presses a button for an autofocus execution instruction according to the GUI screen provided by the controller 100. In accordance therewith, the controller 100 automatically executes an autofocus process using the following correlation formula.

In step S203, the controller 100 of the optical microscope 1 acquires a spot image that is an image in the first focus state (for example, (A) of FIG. 9 to be described later). In step S203, the optical microscope 1 captures and acquires a spot image of a place where the defect on the surface of the sample 3 is not shown while misaligning and moving the field of view for observation (corresponding stage 104) by a small predetermined distance unit (for example, 100 μm) in the X and Y directions. Since the movement of the field of view at this time is a movement in a sufficiently small distance unit, it is assumed that the change in the focus height position during the movement is 0.

In step S204, the controller 100 of the optical microscope 1 executes a process of calculating a spot position based on the spot image as a loop process. This loop process is a process that is repeated a specified number of times (referred to as N1). As a modification, the process of step S204 may not be automatically executed by the controller 100, but be performed manually by a user. The process of step S204 includes step S204A and step S204B.

In step S204A, the controller 100 controls the piezo stage 106 and the camera 112 to integrally move the objective lens 105 and the irradiation mirror 103 in the Z direction, and defocuses the focus height such that the focus height is changed (in other words, shifted) by a predetermined unit amount every time from the first focus height at the time of the first focus. The controller 100 acquires a spot image captured by the camera 112 at each time point of the changed defocus. At this time, the unit amount (in other words, shift amount) of the change in focus height in the Z direction is set as U, and the unit is, for example, μm. With this shift in the focus height, the spot position of the spot pattern in the spot image also gradually moves (in other words, shifts).

In step S204B, the controller 100 calculates the spot position based on the spot image for each shift by using a gravity position coordinate.

The controller 100 performs the above process for the specified number of times N1 corresponding to the shift amount U, and then proceeds to step S205. In step S205, the controller 100 plots a relation between the shift amount U of the focus height at each time point among the images and a shift amount (referred to as Δd) of the spot position of the spot pattern. Based on information on this plot, the controller 100 creates a correlation formula representing a correlation between the shift amount U of the focus height and the shift amount Δd of the spot position.

The shift amount U and the specified number of times N1 (number of shifts and images) are system setting values (one of the above-mentioned setting information 212), and can also be changed by a user setting. The shift amount U may be set in consideration of a resolution of the focus mechanism and the like.

In step S206, the controller 100 calculates the amount of change in sample height ΔZ based on the above correlation formula. The controller 100 can acquire the amount of change in sample height ΔZ as an output by calculating the amount of change in spot position ΔD based on a plurality of spot images and inputting the amount of change in spot position ΔD into the correlation formula.

The steps after step S207 are the same as those in the first embodiment. In step S207, the controller 100 calculates the focus control amount FC based on the amount of change in sample height ΔZ. In step S208, the controller 100 controls the focus mechanism based on the focus control amount FC, and adjusts the focus height such that the focus is on the surface of the sample 3. In step S209, the operator observes the target defect on the surface of the sample 3 using the optical microscope 1.

[Correlation Formula]

Figure 9A:
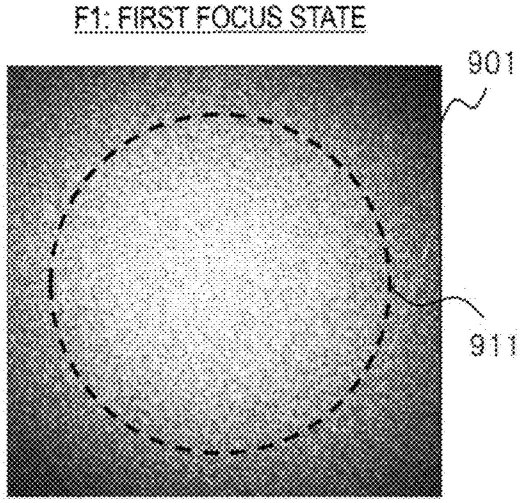
FIGS. 9A to 9E show examples of a process of spot images for creating a correlation formula in the second embodiment.
Figures 9B, 9C, 9D, 9E:
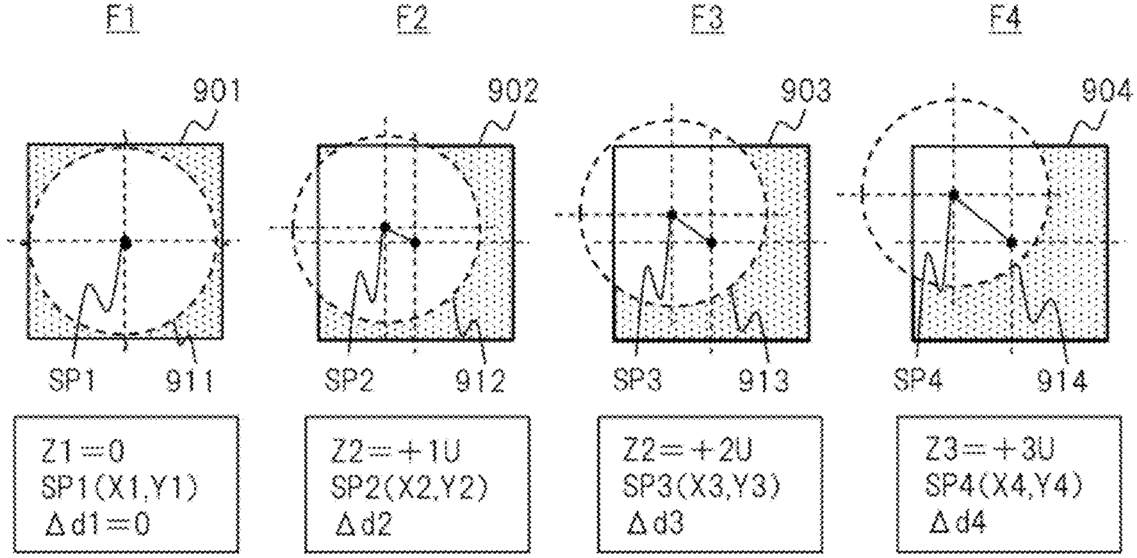

FIG. 9 shows an example of a process of a spot image for creating the correlation formula in the second embodiment. An image 901 of 9A in FIG. 9 shows an example of the spot image that is a dark field image in the first focus state (referred to as F1). The image 901 is an image example in a case where the target defect cannot be observed in the unknown bare wafer as the sample 3. A spot pattern 911 shown by a broken line indicates a region of a binarized circular spot pattern.

9B of FIG. 9 shows a schematic diagram of the first spot image in the first focus state F1 corresponding to the image 901 of 9A. A spot position of the first spot pattern 911 in the rectangle-shaped image 901 is indicated by SP1 (X1, Y1). In this example, a case where the spot position SP1 coincides with a center point of a rectangle-shaped image region is shown. For the purpose of description, the focus height when the image 901 in the first focus state F1 is captured is set to Z1=0. The shift amount Δd of the spot position at this time is set as Δd1, and Δd1=0.

9C to 9E of FIG. 9 show schematic diagrams of spot images when the focus height is gradually defocused by the shift amount U in order from the first focus state F1. An image 902 of 9C is a second spot image in the second focus state (referred to as F2) after the spot image is shifted by the shift amount U from the first focus state F1. The focus height in the second focus state F2 is set to Z2=+1U. A spot position of the second spot pattern 912 is indicated by SP2 (X2, Y2). The shift amount Δd of the spot position at this time is set to Δd2, and Δd2 is a distance of a difference between the spot position SP2 and the spot position SP1. For better understanding the description, a circular arc of the spot pattern is also shown outside the rectangle-shaped image region, but the circular arc is not actually visible.

Similarly, an image 903 of 9D is a third spot image in the third focus state (referred to as F3) after the spot image is shifted by the shift amount U from the second focus state F2. The focus height in the third focus state F3 is set to Z3=+2U. A spot position of the third spot pattern 913 is indicated by SP3 (X3, Y3). The shift amount Δd of the spot position at this time is set to Δd3, and Δd3 is a distance of a difference between the spot position SP3 and the spot position SP1. Similarly, an image 904 of 9E is a fourth spot image in a fourth focus state (referred to as F4) after the spot image is shifted by the shift amount U from the third focus state F3. The focus height in the fourth focus state F4 is set to Z4=+3U. A spot position of a fourth spot pattern 914 is indicated by SP4 (X4, Y4). The shift amount Δd of the spot position at this time is set to Δd4, and Δd4 is a distance of a difference between the spot position SP4 and the spot position SP1.

The controller 100 calculates the shift amounts Δd of the spot position between the images when the focus height is defocused by the shift amount U, for example, as in 9B and 9C described above.

Similar to the example of the process of the first embodiment described above, the spot position of the spot pattern in the image can be calculated by, for example, a method for acquiring a gravity position coordinate from an approximate virtual circle based on positions of intersections between a circular arc of a spot pattern and a rectangle of a field of view.

The controller 100 plots and stores the relation between the focus height and the spot position among a plurality of spot images as in the above example, in other words, the relation between the shift amount of the focus height and the shift amount of the spot position.

FIG. 10 shows a table of the plot corresponding to the example of FIG. 9. As column items, the table includes a focus height [μm], a shift amount (U) [μm] of the focus height, a spot position (SP) (X, Y) and a shift amount (Δd) of the spot position. The shift amount (U) of the focus height is a concept corresponding to the amount of change in sample height ΔZ in the first embodiment, and the shift amount (Δd) of the spot position is a concept corresponding to the amount of change in spot position ΔD in the first embodiment. Rows (row 1 to row 4) of the table show data of the plot corresponding to the examples of 9B to 9E in FIG. 9.

Based on the above table of the plot, the controller 100 creates a scattering diagram that uses, for example, values of the focus height (Z) in a first column as a first axis (X axis) and the shift amounts Δd of the spot position as a second axis (Y axis) as shown on a lower side of FIG. 10. Based on the scattering diagram, the controller 100 creates a relation between the value of the focus height of the first axis and the shift amount Δd of the spot position of the second axis as an approximate straight line by least squares method. The controller 100 calculates a gradient and an intercept of the approximate straight line. The controller 100 can create a correlation formula based on the gradient and the intercept.

[Effects (2)]

As described above, according to the second embodiment, the amount of change in sample height ΔZ can be calculated with higher accuracy by using the correlation formula. In addition, according to the second embodiment, the following effects are achieved. When there is a machine difference regarding the laser light incident angle θ, the relation itself between the shift amount of the focus height and the shift amount Δd of the spot position may change. For example, the size of the spot pattern in the image or the like may change depending on a difference in samples or the like. When the size of the spot pattern or the like changes, the gravity position coordinate of the spot image may also change. Even in such a case, the relation itself between the shift amount of the focus height and the shift amount Δd of the spot position may change. According to the second embodiment, even in these cases, the relation can be created with high accuracy as a correlation formula, and a focusing based on the amount of change in sample height ΔZ can be achieved with higher accuracy by using the correlation formula.

The following is also possible as a modification of the second embodiment. The shift amount U of the focus height is not limited to a constant value set in advance, and may be a variable value. For example, the controller 100 variably determines the shift amount U to be large or small based on information such as the defect position information on the sample 3 as a target and a state of an observed image or the like. Accordingly, it is possible that the amount of change in sample height ΔZ can be acquired by using as few spot images as possible and the focusing can be performed.

Third Embodiment

A microscope system according to the third embodiment will be described with reference to FIG. 11 and subsequent figures. The microscope system according to the third embodiment is a system provided with a review SEM.

[Review SEM]

FIG. 11 shows a configuration of a system including a review SEM, the system is the microscope system according to the third embodiment. This microscope system includes a review SEM including the computer system 100 as a controller, the optical inspection apparatus 2 and the DB 150 connected via a LAN 130 as a communication network, and the like. The review SEM includes a laser dark field microscope as the optical microscope 1 in addition to a SEM 5 that is a scanning electron microscope. A part including the optical microscope 1 is substantially the same as the configuration of the first embodiment or the second embodiment. This review SEM has a function of being capable of observing a defect on a wafer surface generated in a process for manufacturing a semiconductor device.

The controller 100 of the review SEM is provided with a user interface (UI) 160. The UI 160 is applicable to, for example, the same input device 205 and the display device 206 as in FIG. 2, and provides the GUI on the display screen of the display device 206. A user as an operator can give instructions, settings, and the like to the controller 100 through the UI 160, and perform an observation operation of the sample 3.

The external optical inspection apparatus 2, the DB 150, and the like are connected to the controller 100 of the review SEM via the LAN 130 that is a communication network. The optical inspection apparatus 2 optically inspects the sample 3, identifies the defect position, and provides the defect position information and the like. The controller 100 can refer to or acquire information such as the defect position information on the sample 3 from the optical inspection apparatus 2 or the DB 150. The defect position information is information representing the position of the defect on the surface of the sample 3 as an observation target, and is the position coordinate information in the coordinate system of the optical inspection apparatus 2.

The review SEM includes the stage 104 that can move in at least the horizontal direction (X, Y directions), and a sample holder **104*b* on the stage 104 in a chamber 9. The sample 3 is placed and held on the sample holder 104*b*. The objective lens 105 and the irradiation mirror 103 of the optical microscope 1 are also housed in the chamber 9. The sample 3 is, for example, a bare wafer as in the first embodiment or the like. The stage 104 is driven by the stage drive unit 140 based on the control by the controller 100. By moving the stage 104 and the sample holder 2, a target place on the surface of the sample 3 can be moved to a selected position 1101 in the field of view of the optical microscope 1 or a position 1102 in the field of view of the SEM 5**.

In an upper portion of the chamber 9, the SEM 5 is arranged on one side in the horizontal direction, and the optical microscope 1 is arranged on the other side. In the horizontal direction, a reference position corresponding to the axis a3 of the optical microscope 1 is shown by the position 1101. In the horizontal direction, a reference position corresponding to an axis a5 of the radiation of an electron beam from the SEM 5 is shown by the position 1102.

It is possible to observe the sample 3 in detail at a high magnification by using the SEM 5. The SEM 5 emits an electron beam from an electron beam source in the direction of the axis a5 based on the control by the controller 100, and scans the surface of the sample 3 (X-Y plane) while changing the direction of the electron beam with a deflector or the like. The SEM 5 detects secondary charged particles and the like generated from the surface of the sample 3 based on the radiation of the electron beam by a detector, and outputs a detection signal to the controller 100.

The controller 100 of the optical microscope 1 refers to the defect position information on the sample 3 from the optical inspection apparatus 2 when the sample 3 is observed by the SEM 5. The controller 100 uses the optical microscope 1 to perform a positional alignment including an alignment and a focusing with respect to the target defect on the surface of the sample 3 before the target defect on the surface of the sample 3 is observed by the SEM 5. Similar to the first embodiment or the like, the optical microscope 1 has a function of adjusting the height of focus with respect to the surface of the sample 3 under the control of the computer system 100. As a method for this function, a method using a calculation formula as shown in FIG. 5 in the first embodiment or a method using a correlation formula as shown in FIG. 10 in the second embodiment can be similarly applied.

Accordingly, the dissociation between the coordinate system in the optical inspection apparatus 2 and the coordinate system in the review SEM can be corrected, and the observation by the SEM 5 can be performed with high accuracy and efficiency. Based on the control by the controller 100, the SEM 5 observes the target defect on the surface of the sample 3 in detail at a high magnification after the positional alignment is performed by the optical microscope 1.

In the third embodiment or the like, the optical microscope 1 is set as a laser dark field microscope capable of dark field observation, and when not only the dark field observation but also a bright field observation is possible, components for the bright field observation may be further provided. For example, the optical microscope 1 may include a bright field illumination source, a half mirror, and the like between the microscope body 110 and the objective lens 105. In this configuration, for example, the review SEM may perform the bright field observation when the sample 3 as a target is a sample provided with a pattern, and may perform the dark field observation when the sample 3 is a sample provided without a pattern such as a bare wafer.

[Flow (3)]

FIG. 12 shows a flow of review of the sample 3 including the focusing by the review SEM in the third embodiment. This flow includes steps S301 to S309. In step S301, the controller 100 of the review SEM loads a bare wafer, which is the sample 3, onto the sample holder 104*b* of the stage 104 in the chamber 9 through a load lock chamber (not shown). The bare wafer as the sample 3 is a sample provided without a pattern whose height is unknown.

In step S302, the controller 100 refers to or acquires data such as the defect position information from the optical inspection apparatus 2 via communication. The controller 100 moves the stage 104 in the horizontal direction (X, Y directions) in correspondence to the field of view such that the position of the target defect on the surface of the sample 3 represented by the defect position information moves to the position 1101 directly below the objective lens 105 on the axis a3 of the optical microscope 1. The controller 100 provides an instruction to the stage drive unit 140 to move the stage 104. Since there is a misalignment or dissociation and an accuracy error between the coordinate systems between the optical inspection apparatus 2 and the review SEM, the positioning in the horizontal direction (X, Y directions) using the defect position information here is not accurate, and is a provisional positioning.

In step S303, the review SEM performs the provisional initial focus (first focus) as a focusing with respect to the target defect on the surface of the sample 3. At this time, in the third embodiment, the controller 100 performs the first focus by using the focus map. The computer system 100 stores data of the focus map created for the sample 3 in advance in the memory 202 of FIG. 2. Alternatively, the computer system 100 may refer to or acquire the data of the focus map from the DB 150 or the like via communication. The controller 100 refers to the focus map of the sample 3 and performs the focusing with respect to the surface of the sample 3 so as to set the values of the focus height (Z) according to the positions (X, Y) of the target defect in the focus map. In such a case, the controller 100 moves the objective lens 105 and the irradiation mirror 103 up and down in the Z direction by driving and controlling the piezo stage 106 by the piezo stage controller 113.

Step S303 is not limited thereto, and when there is no focus map, the focusing may be adjusted to a predetermined focus height set in advance.

In step S304, the controller 100 of the review SEM acquires a plurality of images obtained by capturing the surface of the sample 3 using the optical microscope 1 as a plurality of spot images. Then, the controller 100 uses the plurality of spot images and calculates the amount of change in sample height ΔZ for the focusing based on the amount of change in spot position ΔD by using the same method as in the first or second embodiment. The process of step S304 is the same as that of steps S203 to S206 of FIG. 8 described above, for example, when the correlation formula in the second embodiment is used.

In step S305, the controller 100 of the review SEM calculates the focus control amount FC based on the amount of change in sample height ΔZ. In step S306, by driving and controlling the piezo stage 106 by the piezo stage controller 113, the controller 100 of the review SEM adjusts the focus height based on the focus control amount FC so as to focus the objective lens 105 on the surface of the sample 3. Up to this point, positioning to a defect position with higher accuracy than the defect position indicated by the defect position information is possible.

In step S307, the controller 100 of the review SEM uses the optical microscope 1 to search for the position of the target defect on the surface of the sample 3 in more detail. Here, the controller 100 searches while gradually moving the field of view in the horizontal direction (X, Y directions) until an image in which the target defect (for example, an image in which the target defect appears near the center of the field of view) appears can be acquired. When the image in which the target defect appears can be acquired, the controller 100 stores target defect position information corresponding to this positional alignment state in the memory 202. This target defect position information is different from the defect position information initially acquired from the optical inspection apparatus 2.

In step S308, the controller 100 of the review SEM moves the stage 104 based on the target defect position information of the above memory 202 so that the target defect on the surface of the sample 3 moves to the position 1102 of the field of view on the axis a5 of the SEM 5.

In step S308, the operator observes the target defect on the surface of the sample 3 in detail by using the SEM 5. When there are a plurality of target defects on the surface of the sample 3, the same process is repeated for each target defect.

[GUI Screen]

FIG. 13 shows an example of a screen including a GUI provided by the computer system 100 in the third embodiment. The screen includes a mode column 1301, an image column 1302, a focus column 1303, and the like. In the mode column 1301, the user can select a mode by an operation. The mode includes a mode "OM" using the optical microscope 1 (in particular, a mode "LDF" using a laser dark field microscope) and a mode "SEM" using the SEM 5. In the image column 1302, an image captured in a set mode (in this example, a spot image captured by the optical microscope 1) is displayed. In the focus column 1303, various information related to the focus adjustment according to the above-mentioned function, GUI components for an operation, and the like are displayed. When a "Normal" button is pressed in the focus column 1303, the review SEM performs an autofocus by multipoint image capture. This is the same function as examples of related art.

When a "Fast" button is pressed, the review SEM performs, for example, an autofocus by the method using the correlation formula in the second embodiment. That is, the review SEM calculates the amount of change in spot position ΔD from the current spot image, calculates the amount of change in sample height ΔZ based on the amount of change in spot position ΔD, automatically adjusts the focus height by the focus control amount FC based on the amount of change in sample height ΔZ and acquires the adjusted focus height. A method for a calculation process executed by the "Fast" button may be selected from the methods of the first and second embodiments and may be set.

A "Correlation Formula" button is a button for instructing creation or update of the above-mentioned correlation formula used for the autofocus due to the "Fast" button. When the "Correlation Formula" button is pressed, the controller 100 automatically creates a correlation formula based on a plurality of spot images by the method in the second embodiment, and stores the created correlation formula in the memory 202. The user can change the focus height by the GUI components such as a lower slide bar. A focus height value is displayed in a right column of the slide bar. As an example, the focus height value is a value in a range from a lowest value 0 to a highest value 65535, and the focus control amount FC is represented by a value of a digital to analog converter (DAC) of the piezo stage 106. The user can perform an efficient observation operation through the GUI screen described above.

[Effects (3)]

As described above, according to the third embodiment, in the review SEM, it is possible to perform the focusing by the optical microscope 1 before the target defect of the sample 3 is observed by the SEM 5. As a comparative example with respect to the third embodiment, for example, in a case of a method for autofocus by multipoint image capture as in the examples of the related art, it is necessary to capture a large number of images and determine a large number of images, and it may require fairly time and efforts. On the other hand, according to the third embodiment, by the processes of the computer system 100, the amount of change in sample height ΔZ can be acquired based on at least two of the plurality of spot images by a relatively simple calculation, and it require less time and less effort. Further, according to the third embodiment, the focusing can be performed even when the sample 3 as a target is a sample provided without a pattern such as a bare wafer as in the first and second embodiments.

Although the embodiments of the disclosure have been described in detail, the disclosure is not limited to the embodiments described above and can be variously modified without departing from a scope of the disclosure. Unless otherwise limited, each component may be singular or plural. Except for essential components, components of the embodiments may be added, deleted, replaced or the like. In addition, an embodiment combining the embodiments is also possible. In the first embodiment and the like, the sample as a target is set to a sample provided without a pattern, and the sample is not limited thereto. When the sample is set to a sample provided with a pattern, the function for focusing of the first embodiment and the like may be applied in the same manner, and a reasonable effect can be achieved.

REFERENCE SIGN LIST

1, 6 optical microscope (microscope system)
2 optical inspection apparatus
3 sample (bare wafer)
5 SEM (electron microscope)
9 chamber
100 controller (computer system)
101 laser light source (dark field illumination unit)
102 laser axis adjustment mirror
103 irradiation mirror
104 stage
105 objective lens
106 piezo stage
110 microscope body
111 spatial filter
112 camera
113 piezo controller

The invention claimed is:

1. A microscope system comprising:

an irradiation optical system configured to irradiate a surface of a sample on a stage with light from an oblique direction;

an observation optical system configured to form an image of scattered light from the surface of the sample;

a focus mechanism configured to change height positions of focuses of the irradiation optical system and the observation optical system with respect to the surface of the sample; and a computer system configured to control the irradiation optical system, the observation optical system and the focus mechanism, and acquire the image formed by the observation optical system, wherein the computer system is configured to regarding the sample, acquire a first image in a first focus state at a first time point and a second image in a second focus state at a second time point, the first image and the second image having different focus heights, calculate a position of a spot pattern in the first image as a first spot position, and calculate a position of a spot pattern in the second image as a second spot position, calculate an amount of change between the first spot position and the second spot position as an amount of change in spot position, calculate an amount of change in height of the sample as an amount of change in sample height based on an incident angle between the oblique direction of the irradiating light and a normal to the surface of the sample and the amount of change in spot position, and adjust the height positions of the focuses by using the amount of change in sample height so as to focus on the surface of the sample.

2. The microscope system according to claim 1, wherein the incident angle in the oblique direction is set to 0, the amount of change in spot position is set to ΔD, and the amount of change in sample height is set to ΔZ, the computer system calculates the amount of change in sample height based on $\Delta Z=\Delta D/\tan\theta$ as a calculation formula.

3. The microscope system according to claim 1, wherein the irradiation optical system is a dark field optical system that radiates laser light as the light.

4. The microscope system according to claim 1, wherein the sample is a sample provided without a pattern that is usable for positional alignment that cannot be observed.

5. The microscope system according to claim 1, wherein the computer system calculates intersections between a shape of the image and a shape of the spot pattern, calculates a virtual shape of the spot pattern from the intersections, and calculates the position of the spot pattern from the virtual shape of a spot image.

6. The microscope system according to claim 1, wherein the computer system is configured to regarding the sample, acquire a plurality of images as the image while shifting a focus height by a predetermined unit amount, plot a relation between the focus height and the spot position among images acquired by shifting by the unit amount in the plurality of images, create a correlation formula based on the plot, and calculate the amount of change in sample height based on the correlation formula.

7. The microscope system according to claim 1, further comprising:

an electron microscope, wherein the computer system is configured to refer to defect position information from an external optical inspection apparatus, control the stage, the irradiation optical system and the observation optical system based on the defect position information, and move a target defect on the surface of the sample such that the target defect is positioned in a field of view of the observation optical system, control the focus mechanism, set the focus height to a first focus height with respect to the target defect on the surface of the sample, and acquire the first image in a state of the first focus height, control the focus mechanism, set the focus height to a second focus height with respect to the target defect on the surface of the sample, and acquire the second image in a state of the second focus height, calculate the amount of change in sample height based on the first image and the second image, control the focus mechanism and adjust the height positions of the focuses by using the amount of change in sample height, and control the electron microscope and observe the target defect on the surface of the sample at the adjusted height positions of the focuses.

8. The microscope system according to claim 7, wherein the irradiation optical system is a dark field optical system that radiates laser light as the light.

9. The microscope system according to claim 8, wherein the sample is a sample provided without a pattern in which a pattern for positional alignment cannot be observed.

10. The microscope system according to claim 8, wherein the computer system is configured to refer to a focus map corresponding to the sample, and when setting the focus height to the first focus height, set the focus height to a focus height according to a position on the focus map.

* * * * *